(12) United States Patent
Yukutake et al.

(10) Patent No.: US 6,603,807 B1
(45) Date of Patent: Aug. 5, 2003

(54) ISOLATOR AND A MODEM DEVICE USING THE ISOLATOR

(75) Inventors: Seigoh Yukutake, Oume (JP);
Yasuyuki Kojima, Hitachi (JP);
Minehiro Nemoto, Hitachi (JP);
Masatsugu Amishiro, Hitachi (JP);
Takayuki Iwasaki, Hitachi (JP);
Shinichiro Mitani, Tokorozawa (JP);
Katsuhiro Furukawa, Oume (JP);
Chiyoshi Kamada, Kokubunji (JP);
Atsuo Watanabe, Hitachiota (JP);
Takayuki Oouchi, Hitachi (JP);
Nobuyasu Kanekawa, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/259,058

(22) Filed: Feb. 26, 1999

(30) Foreign Application Priority Data

Feb. 27, 1998 (JP) ............................................. 10-046827

(51) Int. Cl.[7] ................................................. H01L 29/00
(52) U.S. Cl. ........................................ 375/222; 257/532
(58) Field of Search ........................ 375/222; 333/24 R; 257/296, 304, 305, 306, 311, 507, 532, 533, 685, 692, 693, 787

(56) References Cited

U.S. PATENT DOCUMENTS

| | | | |
|---|---|---|---|
| 3,897,273 A | * 7/1975 | Marsh et al. | 148/DIG. 122 |
| 4,161,785 A | * 7/1979 | Gasparek | 257/236 |
| 4,339,668 A | 7/1982 | Mueller et al. | |
| 4,419,713 A | 12/1983 | Levinson | |
| 4,471,368 A | * 9/1984 | Mohsen | 257/296 |
| 4,654,690 A | 3/1987 | Okada et al. | |
| 5,530,266 A | * 6/1996 | Yonehara et al. | 257/347 |
| 5,663,588 A | 9/1997 | Suzuki et al. | |
| 5,847,443 A | * 12/1998 | Cho et al. | 257/40 |
| 6,095,084 A | * 8/2000 | Shamouilian et al. | 118/723 E |
| 6,297,618 B2 | * 10/2001 | Emori et al. | 320/132 |

FOREIGN PATENT DOCUMENTS

| | | |
|---|---|---|
| EP | 746024 A2 | 12/1996 |
| EP | 746024 A3 | 3/1997 |

* cited by examiner

*Primary Examiner*—Amanda T. Le
(74) *Attorney, Agent, or Firm*—Antonelli, Terry, Stout & Kraus, LLP

(57) ABSTRACT

An isolator is made monolithic by forming a capacitive insulating barrier using an interlayer insulation film on the semiconductor substrate to miniaturize the modem device by the monolithic isolator.

17 Claims, 19 Drawing Sheets

STRUCTURE OF AN EMBODIMENT OF THE PRESENT INVENTION

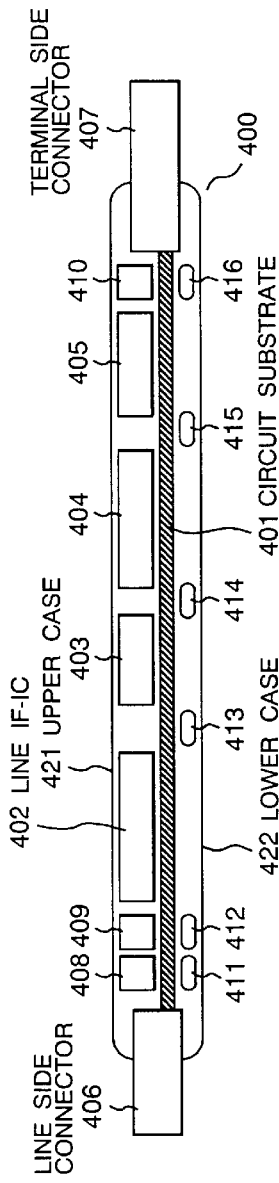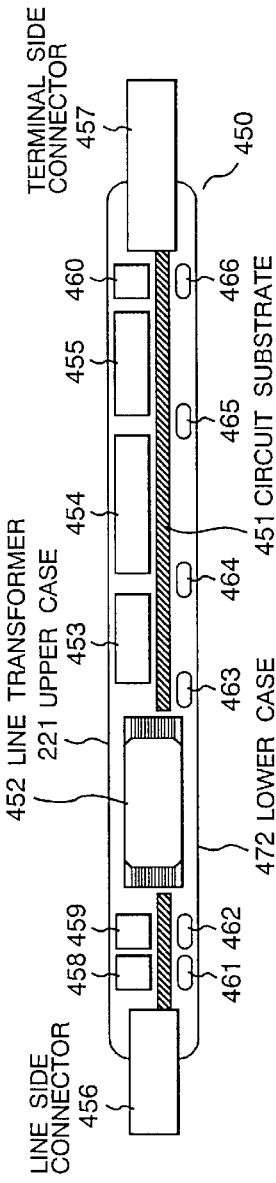

TRADITIONAL TYPE MODEM USING I-AFE

SOFT MODEM USING I-AFE

SOFT MODEM USING I-AFE

PC HAVING A SOFT MODEM USING I-AFE

ISOLATOR AND A MODEM DEVICE USING THE ISOLATOR

BACKGROUND OF THE INVENTION

The present invention relates to an isolator used for electrically separating and insulating between circuits and a modem using the isolator.

To protect extremely public network facilities and protect terminals, the communication field requires a high insulation quality for boundaries (hereinafter referred to as line interfaces) between networks and terminals and miniature communication transformers having a high insulation quality have been used.

However, as personal terminals have come into wide use and expanded recently, more miniature and light terminals are required as portable terminals, and a problem arises that the need for miniaturization is not sufficiently filled by improvement of the material and structure to be used for a transformer, and an application of the isolator has been examined.

In uses such as measurement and medical treatment, there is a case that it is necessary to insulate between the signal detection unit and the signal processing unit such as a sensor and a signal processing circuit and the isolator is known as an insulation separation means in such a case.

In such a case, although the signal voltage is about 100 mV, since a case that the commercial power supply comes in contact is assumed, there is a case that 100 V or a higher voltage is applied as a common mode noise voltage. In these respects, the isolator and line interface have a common problem from the viewpoint of high dielectric strength, miniaturization, and low cost.

The isolator is also the function itself of an insulating transformer, though there is a problem imposed that noise is mixed during transfer of a signal. For example, when a large common mode noise voltage is applied from the commercial power supply, a small signal transmission transformer may not transmit a signal and a transformer type isolator using a dedicated pulse transformer is used. The isolator using an insulating transformer is generally large in the mounting configuration and apt to be expensive.

To improve it, an insulation amplifier using a photo coupler combining a light emitting device and a photo detector has been designed. However, the photo coupler type insulation amplifier easily changes the characteristics due to temperature and to make it highly precise, improvements of the number and arrangement of light emission and detection diodes and circuits have been proposed but they are expensive. Users request further miniaturization.

However, if it is attempted to particularly realize a monolithic semiconductor, a semiconductor process of another material for light emission and detection is required in addition to the silicon semiconductor process, and by use of several kinds of manufacture processes, it is expected that such a monolithic semiconductor will be remarkably expensive, and it cannot be practically realized.

For the purpose of miniaturization, high reliability, and low cost, capacitive isolators have been developed. As a highly dielectric capacitor art as an individual part constituting an insulating barrier, a ceramic capacitor for power or surge protection is known and a circuit block for signal transmission using it is called a capacitive insulating amplifier or capacitive isolator and has been used since 1970s.

As a transmission system for transmitting a signal via a capacitive insulating barrier, the PWM system (called the pulse width modulation system or duty control system) is mainly used. This PWM art is known as a constitution art of an insulating barrier using an insulating transformer or photo coupler before it is used for this capacitive isolator.

In the capacitive isolator, furthermore, for the purpose of miniaturization, low cost, and high reliability, an insulating amplifier of a duty cycle modulation system is proposed using an insulating barrier which is a capacitor with a small capacity formed on a ceramic substrate and a floating comparator.

For further miniaturization, a proposal of reducing the capacity is made and an art of an insulating amplifier for changing a transfer wave form to a differential wave form using a small insulating barrier such as about 1 to 3 pF, reproducing an FM (frequency modulation) or PWM wave form from the differential wave form, and then demodulating is proposed.

With respect to application of a line interface of a modem and others, in U.S. Pat. No. 4,757,528. "Thermally coupled information transmission across electrical isolation boundaries" (hereinafter referred to as Patent 528) and ISSCC86 conference record THPM14.3 (hereinafter referred to as Announcement), Scott L. Falater (Harris Semiconductor) et al. disclose an idea of realization of a monolithic semiconductor using a capacitive insulating barrier.

Although it is not monolithic, three capacitive insulating barriers and a modem application circuit system of digital PWM signal transmission using them are proposed in Japanese Patent Application Laid-Open 7-307708.

For these circuits, a request of further miniaturization and lower cost will be presented in the future and when these prior arts are examined from this point of view, the following subjects and problems arise.

According to the art before Patent 528, an insulating barrier having highly dielectric performance, an input circuit receiving an input signal and generating a PWM waveform, and an output circuit reproducing and demodulating a PWM waveform are different parts and these parts are assembled and mounted so as to constitute one isolator. For example, a capacitive insulating barrier is structured on a ceramic substrate and at least two semiconductor chips are mounted on the same package so as to constitute an isolator. Namely, a constitution using many parts is provided.

In Patent 528 and Announcement, it is indicated that as an idea that a line interface which is an application circuit comprises a monolithic semiconductor, a capacitive insulating barrier and the PWM transmission system are used by the circuit schematic diagram which is a principle and explanation. The manufacturing method is that an isolator comprising a capacitive insulating barrier using the DI (dielectric separation) process and a PWM circuit is formed on a monolithic semiconductor and a sound band signal is transmitted by combining this isolator.

However, the disclosed art is an art regarding control of an insulating switch by a thermal pulse and it is not disclosed that an insulating barrier and circuit of what a kind of structure are structured on a monolithic semiconductor substrate by what a kind of method and as a result, how the structure operates and what an affect the structure produces.

Furthermore, in Japanese Patent Application Laid-Open 7-307708, although two insulating barriers are conventionally used for one transmission path, a circuit constitution for transmitting three signals by three capacitive insulating barriers is indicated but how the circuits operate so as to transmit signals is not indicated. Needless to say, a proposal for making these circuits including the insulating barriers monolithic is not made.

SUMMARY OF THE INVENTION

Users request to make the communication system and the modem device smaller and cheaper and for that purpose, it is necessary for an small isolator having an isolator function substitutable for the ordinary transformer and photo-coupler which have large packing size and a large number of parts. Accordingly, it is considered to be essential to realize a monolithic semiconductor.

However, the aforementioned prior arts do not disclose arts on how capacitive insulating barriers, circuits for using capacitive insulating barriers, arrangement of them, and an insulating method between arranged circuits are structured on a semiconductor substrate and how they are operated so as to realize a monolithic IC isolator, a monolithic IC application circuit, and a monolithic IC line interface circuit. Therefore, how the dielectric strength is realized so as to produce a monolithic IC and characteristics of the highly dielectric capacity formed on the semiconductor are not known at all.

An object of the present invention is to realize a compact means having the isolator function in the communication system and particularly modem device.

An object of the present invention is to realize a monolithic insulating barrier, an IC isolator using the monolithic insulating barrier, IC application circuits, IC line interface or an analog front end (AFE) including an interface or conversion circuits for analog and digital signals.

Another object of the present invention is to provide an art for structuring a capacitive insulating barrier on a semiconductor substrate.

Still another object of the present invention is to provide an art for structuring an isolator using a capacitive insulating barrier on a semiconductor substrate.

A further object of the present invention is to provide a structure, arrangement, and operation method of an application circuit using a plurality of isolators on a semiconductor substrate, particularly a line interface.

Further object of the present invention is to provide a thin PC card in its packaging configuration by using an IC isolator or LSI isolator.

Further object of the invention is to miniaturize a modem device by using the isolator.

Another object of the invention is to miniaturize the communication system and reduce the cost by using the isolator.

The invention uses a monolithic insulating means having isolator function between the line and host side circuits to miniaturize the modem device. To realize a monolithic isolator, an insulating material (hereinafter referred as a insulating band) is formed by using a semiconductor wafer, for example, SOI substrate having an inner layer as the insulating layer. The insulating band extends perpendicularly from the surface of the wafer through the wafer and to reaches the buried oxide film (inner layered insulating layer). Further, the insulating primary circuit region is insulated and separated from secondary circuit region by a protection film of insulating material formed on the surface of the substrate. A DI substrate is used as the insulating means.

Further, the capcitive insulating barrier (capacitor) having high withstanding insulation voltage for coupling the primary side and secondary side is constituted described below. The withstanding voltage per capacitor to the desired withstanding voltage can be reduced by connecting the capacitor in series between the primary side and secondary side. The series connected capacitors are able to be arranged symmetrically by turning back at an internal electrode bridging from the primary circuit region to secondary circuit region. The second means constitutes capacitors using the side wall of the insulating band as an electrode.

As described above, the high withstanding voltage insulation between the primary side and secondary side and the high withstanding capacitive insulating barrier are realized.

By doing this, it is possible to realize highly dielectric strength by the insulating layer and insulating barrier and to correct a reduction in the signal amplitude due to the stray capacitor by the amplification means, or reduce the degradation of a signal due to crosstalk by synchronizing the operation timing, and realize a compact isolator of high performance and a modem interface circuit.

The present invention will be explained slightly concretely hereunder.

According to the present invention, a semiconductor IC is formed by processing a semiconductor wafer having a buried insulating layer as an inner layer, forming an insulating barrier, an isolator, an application circuit of the isolator, and particularly a line interface circuit, overlapping the insulating layer and wiring layer as required, and furthermore forming a protective layer serving as insulation.

Each circuit is insulated by enclosing by the insulating layer, insulating band, and insulating protective layer. The insulating band is, for example, a band-shaped insulating pattern with a width of about 1 to 3 microns reaching the insulating layer from the surface of the semiconductor layer (the thickness is equal to the thickness of the semiconductor layer, for example, 10 to 50 microns) and the insulating band is formed by the trench method for forming a groove of the predetermined pattern reaching the inner insulating layer from the surface of the semiconductor and burying it in an insulator or the ion implantation method for implanting oxygen ions in the semiconductor layer and creating an insulating area. Hereinafter, a portion enclosed by the insulating band is referred to as an electrode area or a circuit area with "area" added.

The insulating barrier in the isolator of the present invention structures a capacitor by forming electrode areas by enclosing by the insulating band and arranging so that a plurality of electrode areas share a part of the insulating band or so that the common length is sufficiently long to obtain a necessary capacity.

By setting the shape and arrangement of the insulating band so that three or more electrode areas share two or more insulating areas, that is, by the multi-trench, it is possible to form capacitors connected in series. The buried insulating layer has a thickness such that the insulating performance corresponding to the width of the insulating band is provided.

The isolator of the present invention is realized by forming the insulating barrier, input circuit, and output circuit on the same wafer. Each circuit is enclosed by an insulating band and insulated from the other parts. The insulating barrier is arranged on the boundary between the input circuit area and the output circuit area in principle.

These circuit areas and the insulating barrier are ganged together and further enclosed by an insulating band. In the input circuit and output circuit, a PWM modulator and PWM demodulator or another circuit depending on the purpose, for example, a circuit digitized not only in the amplitude direction but also in the time base direction such as a $\Sigma\Delta$ modulator and demodulator for a signal in the voice frequency band are included respectively. Between the insulating barrier, input circuit, and output circuit, a protective circuit comprising a non-linear device such as a diode is arranged respectively. The protective circuit is arranged within the circuit area.

The application circuit of the present invention is realized by further arranging an application circuit area enclosed by an insulating band in the isolator. When a plurality of said isolators are included, the insulating barrier may be arranged along the insulating barrier arrangement line.

To operate a plurality of isolators, the transfer block is synchronized as required. In application of the isolators to the line interface circuit, it is particularly possible to further divide the CMOS circuit area into the PMOS group to be connected to the power cable and the NMOS group to be connected to the grounding cable and separate them by an insulating band so that the CMOS circuit is included in the circuit area. The power cables are laid out between a plurality of isolators.

The neighborhood of each isolator may be enclosed by a power cable and grounding cable. For example, with respect to the CMOS circuit, there is an advantage that voltage control requiring no control current and a high off-state resistance are obtained. On the other hand, a through phenomenon of the PMOS and NMOS including the parasitic transistor, that is, latch-up is easily generated. However, there is an advantage that by separating the area as mentioned above, such a phenomenon is hardly generated.

Highly dielectric strength in the thickness direction is realized by use of an insulating inner layer wafer, and a very miniature insulating barrier is realized by forming two electrode areas having a shared insulating band on the same wafer, and a very miniature isolator can be realized by forming the insulating barrier and two circuit areas of an input circuit and an output circuit on the same wafer.

Furthermore, by overlapping electrode areas, connecting the capacities in series, and realizing highly dielectric strength in the horizontal direction, more highly dielectric strength can be realized even if the width of one insulating band cannot be spread due to restrictions on the process. Furthermore, by floating the intermediate electrode during arrangement of the series capacities, extended cables in the strongly energized electric field can be reduced.

In the case of application using a plurality of isolators, by arranging the capacitive insulating barriers such as electrodes and insulating bands, the insulating performance can be homogenized.

The modem as well as the communication system is miniaturized by using the monolithic isolator and miniaturizing the packaging configuration of the insulating means. Additionally, the parts of the modem device and communication system are reduced by using monolithic isolator and mounting the isolator in a LSI having other functions.

BRIEF DESCRIPTION OF THE DRAWINGS

FIG. 6 is a view showing modem device using the monolithic AFE according to the present invention;

FIG. 9 is a structural diagram of the PC having soft modem built in;

DETAILED DESCRIPTION OF THE PREFERRED EMBODIMENTS

Figure 1:
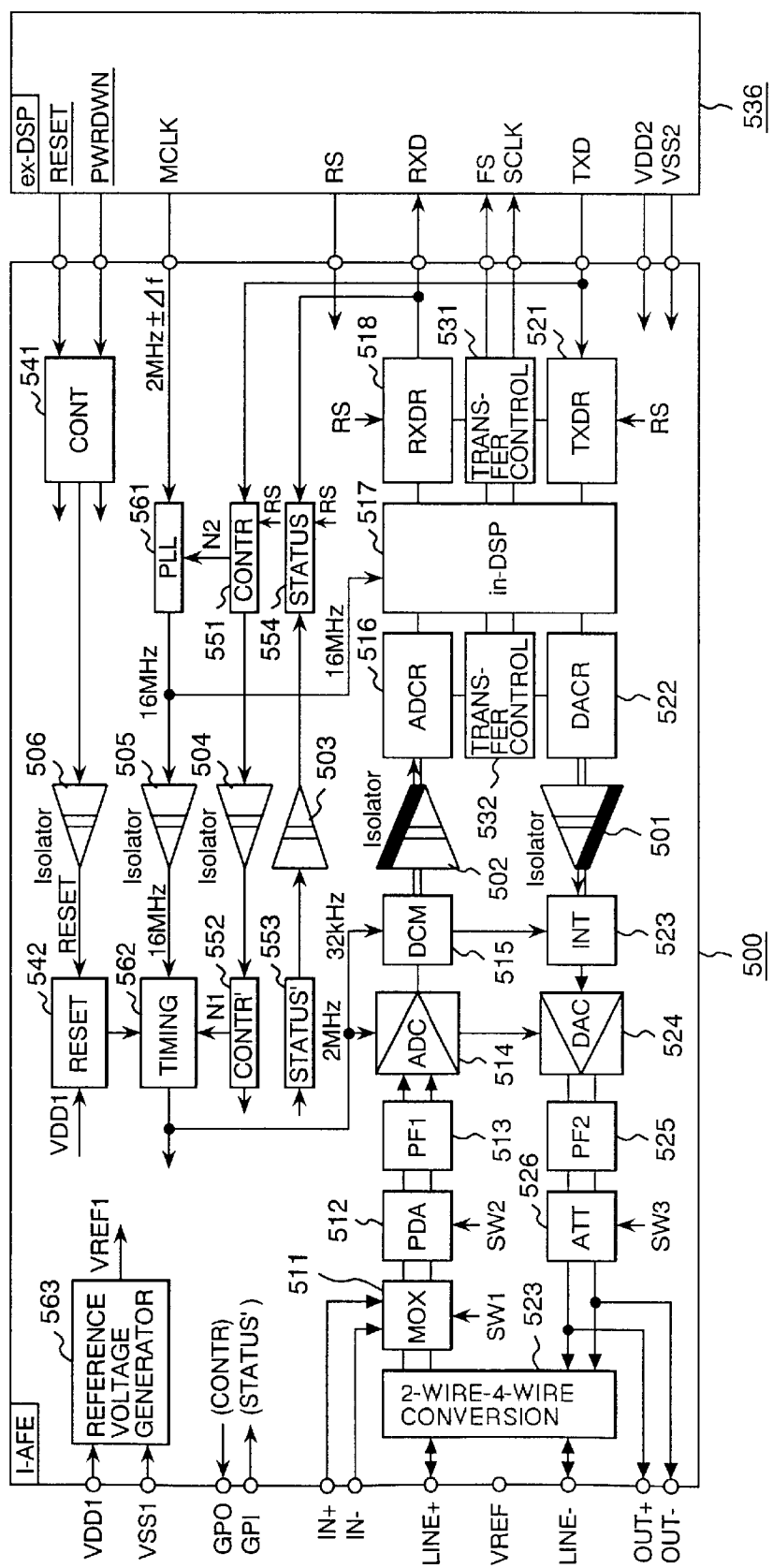
FIG. 1 is a circuit block diagram showing the monolithic AFE of the first embodiment according to the present invention.

FIG. 1 is a circuit block diagram of an embodiment when the monolithic digital isolator of the present invention is applied to an analog front end (AFE) described in FIG. 13 and the following. The AFE of this embodiment is used for processing a voice band signal and performs over sample (2 MHz) AD and DA conversion as analog and digital conversion, reduces the speed to 32 ksps once by a decimeter filter and interpolator, furthermore performs the low pass filtering process by the internal DSP, and finally inputs or outputs digital data at a speed of 8 ksps.

In FIG. 1, numeral 500 indicates a monolithic analog front end (I-AFE) containing digital isolators 501 to 506 which have a high withstanding voltage capacitor for insulating and separating as described in FIG. 13 and thereafter. The I-AFE 500 comprises an analog input line including a multiplexer (MUX) of the original AFE, a pad amplifier (PDA) 512, a prefilter (PF1) 513, an over sample analog to digital converter ADC 514, a decimeter filter (DCM) 515, an AD conversion output buffer (ADCR) 516, a built-in (in-) DSP 517, and a receiving output buffer (RXDR) 518, an analog output line including a sending buffer (TXDR) 521, a DA conversion input buffer (DACR) 522, an interpolator (INT) 523, an over sample digital to analog converter DAC 524, a post filter (PF2) 525, and an attenuator (ATT) 526, data I/O transfer controllers 531 and 532 of the in-DSP 517, and a 2-wire-4-wire conversion circuit 533 at an analog I/O terminal with a control circuit added. The inside of the I-AFE 500 is reset or controlled in power down by a control circuit (CONT) 541.

A reset signal is transmitted to the circuit on the left (hereinafter referred to as the analog I/O side) via the digital isolator 506, combined with a reset signal following power ON or OFF on the analog I/O side by a reset circuit 542, and used as a reset signal for the circuit on the analog I/O side. To finely control the I-AFE 500, an external device uses control registers (CONTR) 551 and (STATUS) 554.

The content of the CONTR 551 (STATUS' 553) is copied into the control registers (CONTR') 551 and STATUS 554 of the analog (digital) I/O circuit via the digital isolators 504 and 503 and controls SW1 to SW3 of the analog I/O side circuit and other circuits and sets the level of a general purpose output port (GPO).

The operation timing of the I-AFE 500 is converted to 8-fold 16 MHz by a 2-MHz clock (MCLK) PLL given by an external (ex-) DS0 536 and used as basic timing together with the inputted 2 MHz. Needless to say, it is also transmitted to the analog I/O circuit via the digital isolator 505 and various timings are generated by a timing circuit 562.

A reference voltage generation circuit 563 is a circuit for giving a reference voltage to the analog I/O circuit for operating by a single power supply and generates a reference voltage VREF of (VDD1−VSS1)/2.

Next, the operation will be explained. The 2-wire-4-wire conversion circuit 533 is a circuit for exchanging 2 wires of the pay station line and 4 internal sending and receiving wires when the I-AFE 500 is used in a mode device and has functions of line impedance matching and I/O amplification. An analog input signal is inputted via the 2-wire-4-wire conversion circuit 533 or directly inputted from the IN+ and IN− terminals. However, the MUX 511 is switched and used by a signal SW1 beforehand according to one of them. The PDA 512 can switch the gains 0 dB and 6 dB by a signal SW2.

The PF1 513 is an analog filter for deleting a signal of an unnecessary frequency band before performing AD conversion and a secondary low pass filter at a cut-off frequency 48 kHz in this embodiment. The ADC 514 is a secondary ΔΣ modulator operating at 2 Msps and outputs an AD conversion result 2 bits long every 0.5 μs. The ADC 514 transmits this AD conversion output to the DCM 515 and thins it to 2 ksps. The output of the DF1 515 is 16 bit/w. However, the speed is slow such as 32 ksps, so that the DF1 515 serially converts it to 2 Msps and transmits it to the in-DSP 517 via the ADC 516 of the I/O side circuit together with the timing signal via the isolator 502. The in-DSP 517 performs the flat characteristic correction for this decimeter output by the digital signal processes IIR and FIR and performs the LPF process at 4 kHz or less. The in-DSP 517 serially transmits the processing result to the ex-DSP 236 as 16-bit/w data for every 8 ksps via the receiving buffer 518.

Next, the analog output line receives the data (TXD) to be outputted from the ex-DSP 536 from the sending buffer TXDR 211 every 8 ksps, performs the same filtering process as that of analog input by the in-DSP 517, and transfers this result to the interpolation filter (INT) 523 at a speed of 32 ksps by interpolating it as 16-bit/w data via the DA output buffer (DACR) 522. Also in this case, the analog output line performs serial conversion and transmits the data via the isolator 501. The INT 523 further performs the interpolation process, transfers it to the DAC 514 as 6-bit/w data at a speed of 2 Msps, and outputs an analog value. The loop-back component remaining by the process by the in-DSP 517 and the INT 523 is removed by the post filter PF2 525 and outputted via the ATT 226 which can switch 0 dB, −6 dB, and −∞ dB. For these operation timings of the analog output line, the timings of the analog input line are used.

These processing timings are timings that the processing timing of the ΔΣ modulator and demodulator of basically the same timing among the 2-MHz timings, the interpolator and decimeter processing timing to be inputted and outputted at 2 Msps and 32 ksps, and the DSP processing timing to be inputted and outputted at 32 ksps and 8 ksps are allocated in order. Therefore, the analog I/O side circuit and digital I/O side circuit are separated by the isolators 201 to 205. However, it is essential to synchronize and operate them and this is the reason why it is important to set an isolator only for timing.

Next, application of the I-AFE 500 to a modem together with the ex-DSP 536 will be explained.

The AFE 500 viewed from the ex-DSP 536 is an I/O circuit of an analog signal and the sample timing is important. Therefore, in most modems, the sample timing of the ADC 514 is adjusted so that a most advantageous timing for discrimination and decision can be obtained during demodulation. Therefore, delay or advance of the timing is transmitted to the I-AFE 500 from the ex-DSP 536 by the clock MCLK. Namely, to advance the timing, Δf is added and to delay the timing, −Δf is added and the AFE 500 is informed of it.

This process is performed every several tens ms or several hundreds ms. When the I-AFE 500 operates at a selfish timing, it does not agree with the timing requested by the ex-DSP 536, so that data becomes too much or too little, and the processing time breaks down, and large noise is generated. To synchronize the I-AFE 500 with this clock delaying or advancing, the PLL is installed inside the AFE 500 so as to synchronize the internal timing.

In this embodiment, data transfer between the decimeter filter and interpolator and the in-DSP is serial high-speed transfer, so that there is an effect that the number of isolators is decreased. Since the modem includes a plurality of standards, a plurality of sample timings may be requested. To respond to it, the division ratio of the PLL 561 and the timing circuit 562 can be controlled by the CONTR 562.

Figure 2:
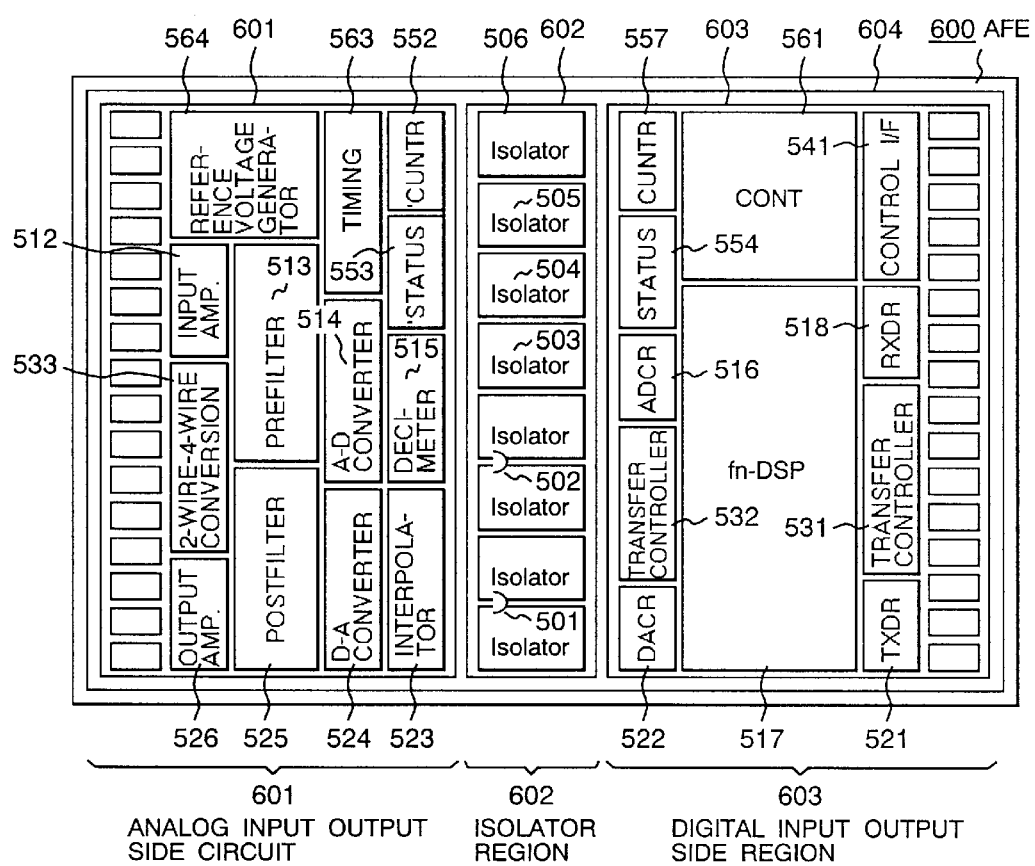
FIG. 2 is a view showing the layout of AFE integral circuit shown in FIG. 1.

Next, the layout concept on the integrated circuit shown in Fig is shown in FIG. 2. In FIG. 2, a whole 500 indicates the whole AFE integrated circuit and the references mark given to the region surrounded by the closed line (trench) correspond to that of FIG. 1 respectively.

The characteristics of this layout are that the circuit areas are further enclosed by trenches so as to form an analog I/O side circuit area 601, an isolator area 602, and a digital I/O side circuit area 603, and (1) a double trench is formed between each areas so as to insulate between the areas, and (2) furthermore the whole is enclosed by a trench 604 so as to insulate between the chips. The trench 604 is a multi-trench.

By enclosing each circuit block in the circuit areas 601 to 603 by a trench, the circuits are insulated and separated from each other and the devices are separated. However, when furthermore a multi-trench is used and the trenches are grounded, a noise shield due to mutual interference can be formed.

By making the multiplexing rate of trenches in the circuit area 601 and 603 higher one step than the multiplexing rate of trenches of the insulator 602 having the highly dielectric capacitor portion as shown in FIG. 13 and the following, the insulation cooperation is taken into account so as to limit the destruction mode to the capacitor portion. By doing this, even if a high voltage more than the standard is applied, there is an effect that a system can be constructed with the damage limited.

Figure 3:
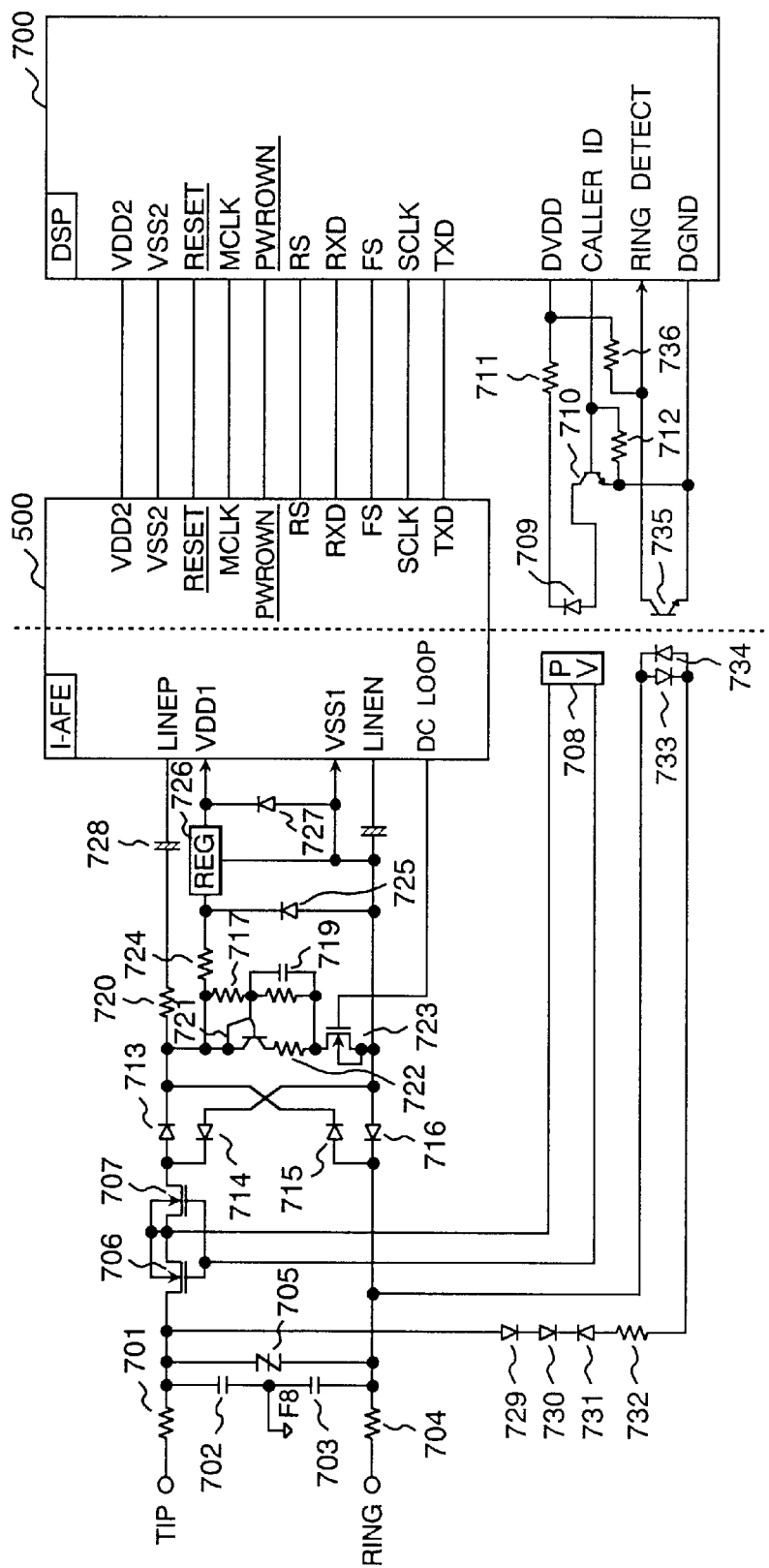
FIG. 3 is a circuit block diagram of the modem using the AFE integral circuit shown in FIG. 1.

Next, FIG. 3 is a circuit diagram of an embodiment of a DSP modem to which the AFE shown in FIG. 1 is applied. In FIG. 3, numeral 500 indicates AFE and 700 indicates ex-DSP. When the modem is connected to a telephone line, it is connected to connection terminals TIP and RING via a protection circuit comprising resistors 701 and 702, capacities 703 and 704, and a surge protection device 705.

Numerals 706 and 707 indicate switches formed by NMOS transistors and they are connected to a photo detector (for example, a solar cell) 708. The photo detector 708 receives light of a light emission diode 709, turn NMOS transistor switches 706 and 707 on or off, and supplies power supplied via TIP and RING to the circuit on the right of the switches. The light emission diode 709 is controlled in light emission by the switch circuit comprising a transistor 710 and resistors 711 and 712. The control signal of this switch is POWER ON. Diodes 713, 714, 715, and 716 constitute a bridge and have a function for keeping the current direction constant regardless of the direction of the DC voltage applied to TIP and RING.

The circuit comprising resistors 717 and 718, a capacity 719, transistors 720 and 721, a resistor 722, and an NMOS transistor 723 is a DC loop circuit, and when the control output terminal GPO of the AFE 500 goes high, the NMOS transistor turns on, and Darlington transistor circuits 720 and 721 operate according to the bias of the resistors 717 and 718 and flows a loop (looping) current balanced with the feedback resistor 722.

The circuit comprising a resistor 724 and a 18-V Zener diode 725 is a protection circuit for preventing application of an excessive voltage to a 3-terminal regulator 726 and the I-AFE 500. A capacity 727 is a smoothing capacitor and capacities 728 and 740 are an output circuit of I-AFE and a signal connection capacitor.

When sending by the modem, the POWER ON signal is generated first, and the NMOS switches 706 and 707 are turned on, and the 3-terminal regulator 726 is connected to the line, and a current is supplied to the AFE, and the GPO is put on the high level from the TXD via the CONTR next, and the NMOS switch 723 is turned on, and the loop current is conducted so as to notify the switchboard of the office that the modem is connected to the line.

Next, the modem sends a dial signal to the I-AFE 500 via the capacities 728 and 440 and waits until the switchboard connects the remote modem. The connected remote modem generates the normal modem signal, so that the modems mutually perform communication via the AFE hereafter.

The capacity 729 and Zener diodes 730 and 731 are a sensitivity adjustment circuit for rejecting a response to an incoming signal at lower than the fixed voltage, and the resistor 732 is a current limit resistor of the diode 733 or the light emission diode 734, and the photo transistor 735 detects emitted light and notifies the modem 700 of it as a RING DETECT signal when an incoming signal flows in the light emission diode 734 through a load of the resistor 736.

During reception of the modem, this signal is notified to the modem, and the POWER ON terminal responds to it, and the NMOS switches 706, 707, and 723 are turned on, and the loop current is conducted, and the power is turned on, and a modem response signal is repeated via the capacities 728 and 740. Hereafter, the modem signal is sent and received almost in the same way as that during sending.

According to the embodiments explained in FIGS. 1 to 3, the following characteristics and effects can be obtained. The first characteristic is that the analog I/O side circuit including the circuit of individual parts on the left of the arrangement of isolators of the AFE all insulates the digital I/O circuit on the right.

Conventionally, the circuit is insulated by an insulating transformer and if anything, located on the right. The transformer can be deleted by the I-AFE in this embodiment and a miniature modem device can be constructed.

The second characteristic is that power is supplied to the analog I/O side circuit of the I-AFE from the office and the power is supplied. Therefore, it is not necessary to supply the power of the analog I/O device from the modem device side and it contributes to reduction in the whole power consumption.

The third characteristic is that the switches of the individual part portion are divided into the POWER ON switches 706 and 707 and the loop current switch 723. By doing this, power is supplied to the AFE without conducting the loop current at start of line connection and for example, it can be used for sending and receiving a signal between the switchboard and the modem such as notification of the originating number.

Figure 4:
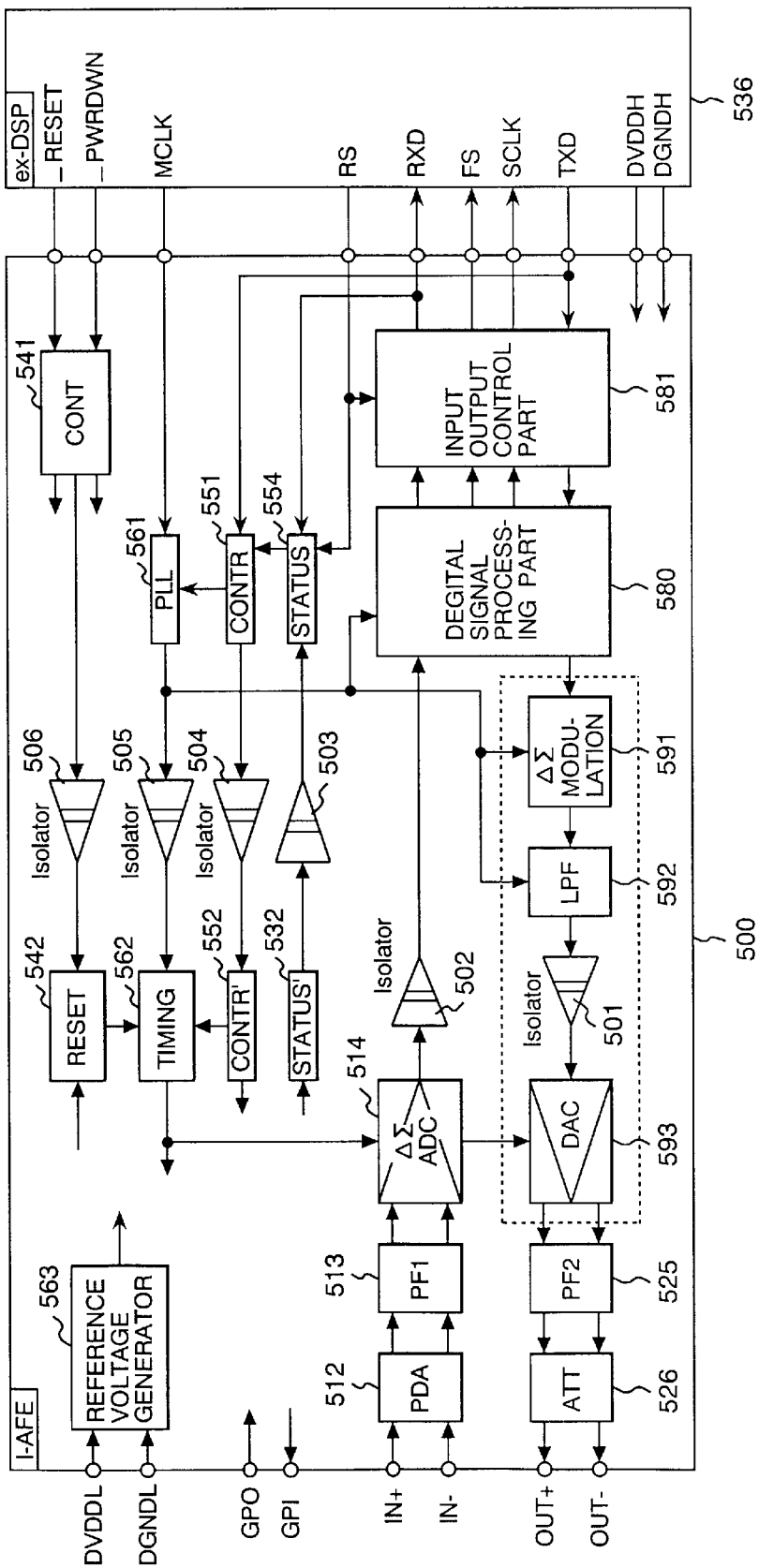
FIG. 4 is a circuit block of the modem using monolithic AFE integral circuit of the other embodiment.

FIG. 4 is a circuit diagram showing another embodiment which applies the monolithic digital isolator to AFE. Except that the intervening position of the isolator is different and the 2-wire-4wire conversion circuit is positioned at external side, the embodiment is the same constitution as FIG. 1. Same reference numerals show the same parts with same functions. Therefore, only different points are described here.

As a 2-wire-4-wire conversion circuit requiring ratio accuracy of circuit constitution parts is connected as external parts, the input signal of the line side is inputted to the pad amplifier 512 as complimentary signals (IN+, IN−). The received signal is converted through the pre-filter 513 by the ADC 514 and after that, inputted to the digital signal processing part 580 of host side through the isolator 501. The digital signal processing part 580 comprises a decimeter for A-D converted receiving signal, an interpolator for D-A converted transmitting signal, and low-pass filter for receiving and transmitting signal.

An input output control part 581 performs interface between digital signal processing part 580 and internal circuits of host side. The isolator 501 of the receiving system is able to reduce the bit number of digital signal and the number of the isolator 501 by arranging the isolator 501 between ADC with delta-sigma modulation and the decimeter of the digital controller 580. In the transmitting system, the digital signal from the interpolator of digital signal processing part 580 is processed by a $\Sigma\Delta$ modulator 591 structured by digital circuits and the low-pass filter 592. The processed signal is then transmitted to DAC 593 of the line side through the isolator 502. As the bit number of the digital signal is small where the isolator is arranged in transmitting system, it is possible to reduce the number of the isolator.

While the 2-wire-4-wire conversion circuit requires large lay-out area to realize high ratio accuracy, the present embodiment makes it possible to suppress the tip area by arranging the 2-wire-4wire conversion circuit at external side of the tip. Additionally, the number of the isolator is reduced by arranging the isolator of the transmitting and receiving signal system between ADC, DAC which has small bit number and the digital signal processing part.

Figure 5:
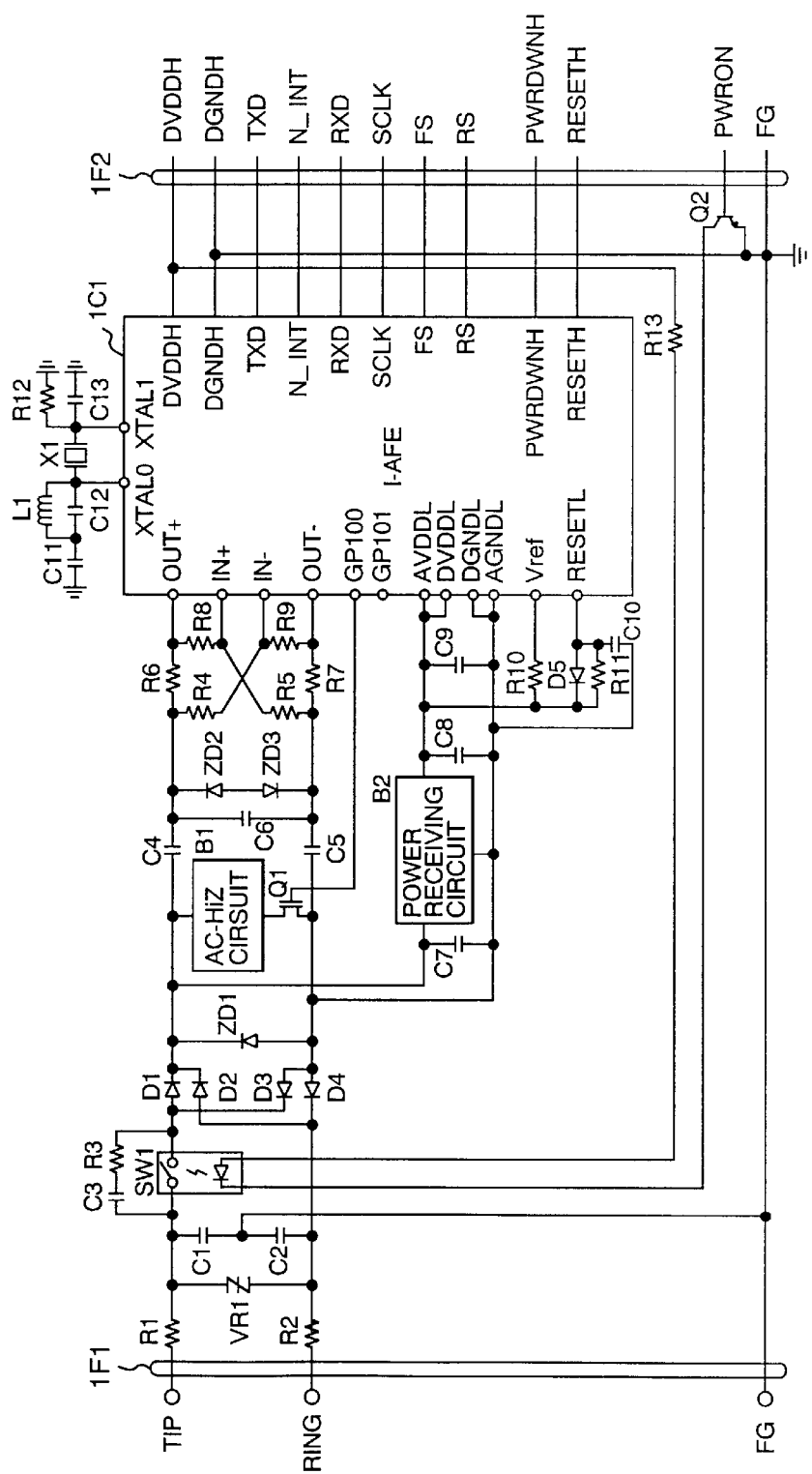
FIG. 5 is a block diagram of the modem using AFE integral circuit shown in FIG. 4.

FIG. 5 shows an embodiment of the line interface circuit of the modem using I-AFE shown in FIG. 4. The interface circuit is connected to the telephone line through the IF1 and to the signal processing circuit through IF2. As shown in FIG. 5, the circuit includes a I-AFE ICI, AC high impedance circuit B1, power receiving circuit B2, resistors R1 to R13, capacitors C1 to C13, surge protecting elements VR1, relay switch SW1, zener diode ZD1, diodes D1 to D5, choking coil L1, crystal oscillation element X1 and transistors Q1 and Q2.

The connection relationship of circuit elements is shown in FIG. 5, the relationship between the signals and power receiving are explained below. IF1 has a terminal TIP, RING and FG for connecting the modem to the telephone line. The terminal FG is grounded to the earth and the communication and power supply by the line are performed through the terminals TIP and RING, respectively. The resistors R1, R2, capacitors C1, C2, surge protecting element VR1 form a protection circuit.

A relay SW1 comprises MOS transistors, light receiving elements and light emitting diode and is turned on and off by the transistor Q2 and resistor R13 and supplies power and signals to the right side circuit of the switch. The control signal of the switch is PWRON of IF2. Diodes D1 to D3 form a rectifier bridge and keep the direction of the current in a predetermined direction regardless of the direction of the direct current voltage applied to the terminal TIP and RING. The zener diode ZD1 acts as a second surge protection element. The circuit block B1 shows high impedance characteristic to AC and law resistance characteristic to DC.

The circuit block B1 is connected in series with the transistor Q1 to form DC closed loop circuit. The NMOS transistor Q1 turns on when the general purpose input terminal GPI00 of IC1 (I-AFE) becomes high level, current flows through the looped circuit. The capacitors C4 and C5 for preventing DC component from passing and passes only signal component.

The capacitor C6 and zener diodes ZD2 to ZD3 form a third surge protection circuit. The resistors R6 and R7 are terminating resistors and the right side terminal is coupled to the output OUT+ and OUT– of transmitting amplifier in ICI. The resistors R4 to R9 form a resistor network constituting a 2-wire-4-wire conversion circuit and subtract transmitting signal component of I-AFE from the signal received from the line. The capacitor C7 is the input capacitor of power receiving circuit B2, C8 is a output capacitor of the power receiving circuit, the capacitor C9 is a de-coupling capacitor for receiving DC power from the output side of the diode bridge and supplies it to ICI.

The crystal oscillator X1, capacitors C11 to C13, resistors R12, the choking coil L1 form an oscillation circuit with an amplifier for oscillation in ICI. By the above constitution, the stable oscillation may be continues. The resistor R10 is an external resistor for controlling the standard voltage in the ICI. The resistor R11, capacitor C10, diode 15 detect the leading edge of supply voltage VDDL in ICI with a detecting circuit in the ICI and generate a reset signal. A power supply VDDH is supplied to the ICI through IF2 from a signal processing means (not shown). The capacitor C3 and resistor R3 form a filter forming a signal path of the calling.

When transmitting by the modem, PWRON signal is caused to turn the switch Sw1 "on" and the power is supplied to ICI by connecting the power receiving circuit to the line firstly. Next, the GPI00 terminal becomes high level through CONTR (not shown) from TXD terminal and the connection of modem to the line is informed to the switchboard of the telephone station by flowing of the loop current.

The dialing (DTMF) signal is sent out from the TXD terminal as a transmitting signal. In the I-AFE, the signal is passed to the line in the form of digital from the signal processing circuit through the isolator and then the signal after being converted into analog signal by the circuit is sent out to the line.

When receiving the dialing signal, the switchboard connects the modem to a modem on the other end of the line. As the connected modem of the other end of the line generates an ordinary modem signal, the ICI receives it. The received analog signal is changed into digital signal in the ICI and passed to the signal processing circuit through the isolator. Then, it is passed to the signal processing circuit through RXD terminal and IF2. Further, the receiving and transmitting are performed and the communication is done by the modem through AFE each other. When termination, after an upper grade protocol is finished, GPI00 terminal becomes law level and PWRON signal is turned off.

Generally, receiving begins calling signal. The call signal is sine wave form having frequency of 15 to several tens of Herz, and voltage over several tens of volts and the signal through capacitor C3 and resistor R3 supplied to the diode bridge and the power source circuit. The ICI detects the turned-on state of the power source by the rest signal, and transfers the state to the signal processing circuit and control circuit.

The control circuit raises up PWRON signal to receive DC power and supplies it to ICI. Therefore, GPI00 terminal becomes high level to close the DC loop. Then the receiving sequence is raised up. The receiving sequence send back a response signal and goes on the initial training and communication sequence. These sequence are standardized and well-known and the receiving sequence of the modem signal is the same as transmitting.

As described above, features and effects are obtained by the present embodiment. The first feature is that the analog input output circuit including respective left side parts (IF1 side) of isolator arrangement of I-AFE and a right side (IF2 side) digital input output circuit are isolated. In the prior art, the part was is insulated using an insulating transformer and a photo coupler, and by the I-AFE of the embodiment it makes possible to eliminate the transformer and photo coupler, as a result, the modem becomes small size.

The second feature is that the line side (analog input output side) circuit receives electric power from the phone station and supplies the power to the circuit. Therefore, there is no need to supply the power of analog input output part from the modem side. Accordingly, it is able to reduce power consumption. The third feature is that the switches of respective parts are separated into PWRON switch SW1 and DC loop switch Q1. Accordingly, at start of the line connection, the power is supplied to AFE without flowing the loop current and for example, the power is used for the communication between the switchboard and modem in notification of the originating number.

FIGS. 6a and 6b is a structural diagram showing the concept of an embodiment that the monolithic line interface of the present invention is applied to a card modem device.

FIG. 6a shows an embodiment of the present invention and FIG. 6b shows a conventional card modem. In FIG. 6a, numeral 400 indicates a whole card modem of this embodiment, 401 a circuit substrate of this embodiment, 402 a line interface IC of this embodiment, 403 an AFE, 404 a DSP, 405 other ICs, 406 a line side connector, 407 a PC side connector, 408 a varister, 409 a highly dielectric capacitor, 410 a capacitor, and 411 to 416 chip parts such as other resistors and capacitors.

In FIG. 6b, numeral 450 indicates a conventional whole card modem, 451 a conventional circuit substrate, 452 a line transformer which is a conventional line interface, 453 an AFE, 454 a DSP, 455 other ICs, 456 a line side connector, 457 a PC side connector, 458 a varistor, 459 a highly dielectric capacitor, 460 a capacitor, and 461 to 466 chip parts such as other resistors and capacitors.

This drawing shows the section of the card modem which is schematically indicated and the comparison shows that in the conventional card modem 450, the circuit substrate 451 is hollowed out and the line transformer 452 is arranged in the hollowed portion, while in the embodiment of the present invention, the line interface IC 402 can be mounted almost in the same way as the other ICs shown in from 402 to 405.

Therefore, it is not necessary to hollow the circuit substrate 401 and the present invention is economical. Since a special transformer is not used, there is the possibility that the constitution can be made economical. Furthermore, since the transformer can be omitted, there is a possibility of further miniaturization.

Figure 7:
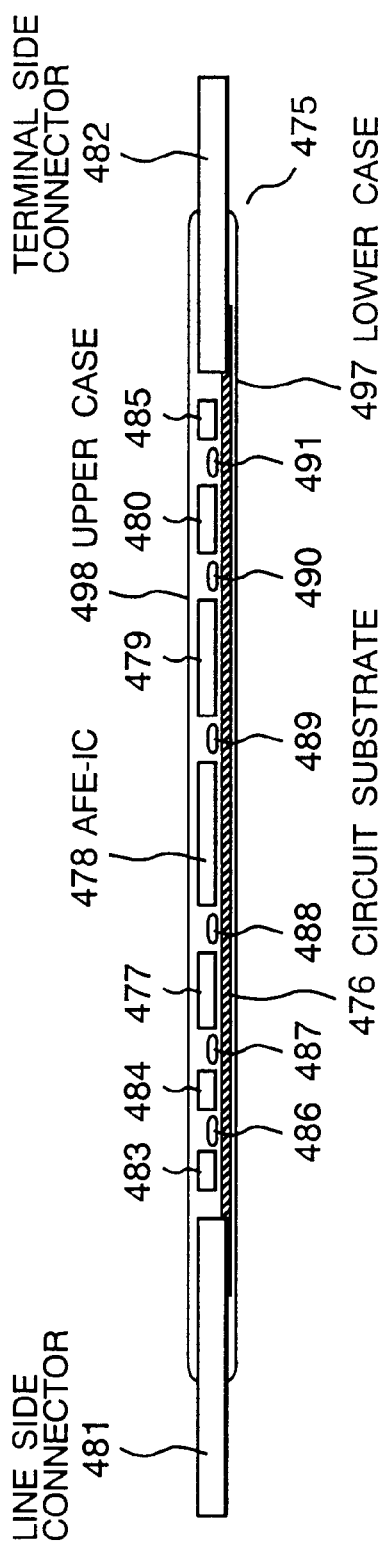
FIG. 7 is a structural view showing modem device using the monolithic AFE according to the present invention.

FIG. 7 shows another embodiment of a card type modem using the I-AFE of the present invention as shown in FIG. 6a. In FIG. 7, the modem 475 includes a circuit substrate 476, line interface IC 477, I-AFE 478, DSP 479, IC 480, line side connector 481, terminal side connector 482, varistor 483, high withstanding voltage capacitor 484, capacitor 485, and other tip parts 486 to 491 such as capacitors and resistors.

In comparison with the embodiment shown in FIG. 6a, the thickness of the PC card is able to be made thinner than 5 mm by packaging using only one side of the circuit substrate 476 at packaged state. For example, the present invention is possible to be applied to the PC card having thickness of 3.3 mm (Type I).

Figure 8A:
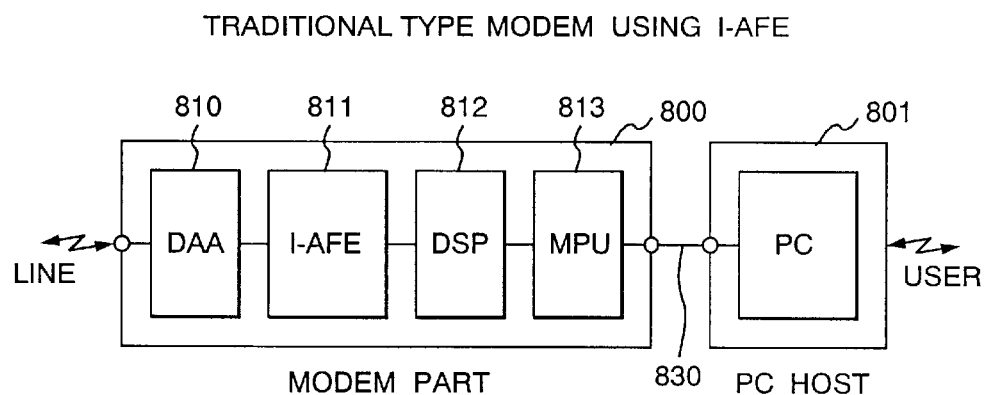
FIG. 8 is a structural diagram of the modem and communication system using I-AFE according to the present invention.
Figure 8B:
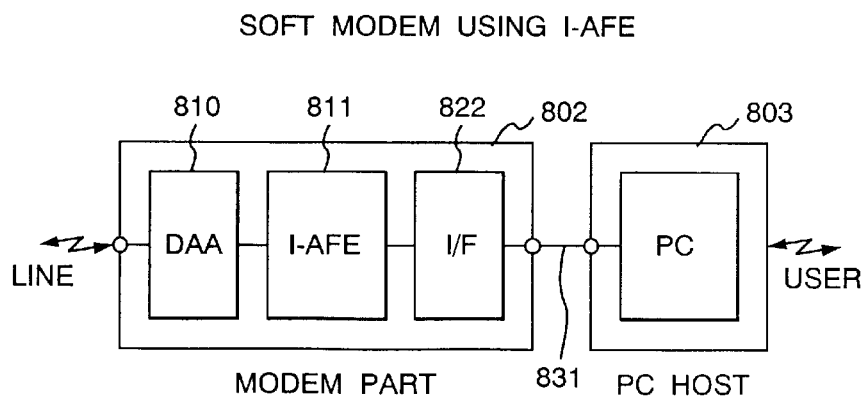

FIGS. 8a and 8b are structural diagrams of an embodiment of a communication system using a combination of a modem device using I-FAE and a host (PC). In FIG. 8a, numeral 810 indicates, for example, the portion of the discrete circuit shown in FIG. 23 and it is a DAA (direct access arrangement) means including a protection device, DC connection switch, DC loop circuit, DC loop switch (DC loop), and call signal detection circuit.

Numeral 811 indicates insulating, filtering, AD, and DA means like the I-AFE, 812 a modulation and demodulation means like the DSP, and 813 a transmission control means comprising an MPU, memory, and software and a modem section 800 comprises these units. Numeral 801 indicates an application control means such as a PC and it is a whole control CPU of the internal host CPU of the WS, PC, and PDA, the dedicated DSP, or the cluster modem and it is called a PC basic section or host here.

FIG. 8a shows an embodiment using I-AFE in the constitution that the signal process is hierarchically divided among the DSP performing the modulation demodulation processing, MPU performing transfer control, and PC performing the signal processing of host side, so to speak, the conventional type modem constitution, and the expensive and large insulating transformer which is conventionally used in the DAA is deleted by the I-AFE, and the number of photo-couplers is decreased, and the embodiment contributes to miniaturization and improvement of economical efficiency. The monolithic isolators are built in the AFE. However, they may be structured so as to combine with other parts if necessary. The I-AFE and DSP may be integrated.

FIG. 8b is a structural diagram of an embodiment of a soft modem device using I-AFE. In FIG. 8b, each same numeral as that shown in FIG. 8a indicates the same name, and numeral 822 indicates an interface (I/F) means for connecting the modulation and demodulation means 811 and the application control means 803 and it includes a buffer memory about 0.5 MB and other control logic circuits.

The characteristic of this constitution is that by processing the modulation and demodulation means and transmission control means in a batch by the host CPU, the hardware of the modulation and demodulation means (DSP) 812 and the transmission control means (MPU) 813 is reduced and substantial miniaturization and improvement of economical efficiency of the modem device are realized.

In this constitution, since the hardware of the modem section is made smaller, the effect of miniaturization and improvement of economical efficiency by the monolithic isolators is seen conspicuously large. Even in this constitution, the monolithic isolators may be combined with other than the AFE. The I/F means has a main function for temporarily storing AD and DA conversion data and if it is integrated with the I-AFE, the modem device can be miniaturized more.

Figure 9A:
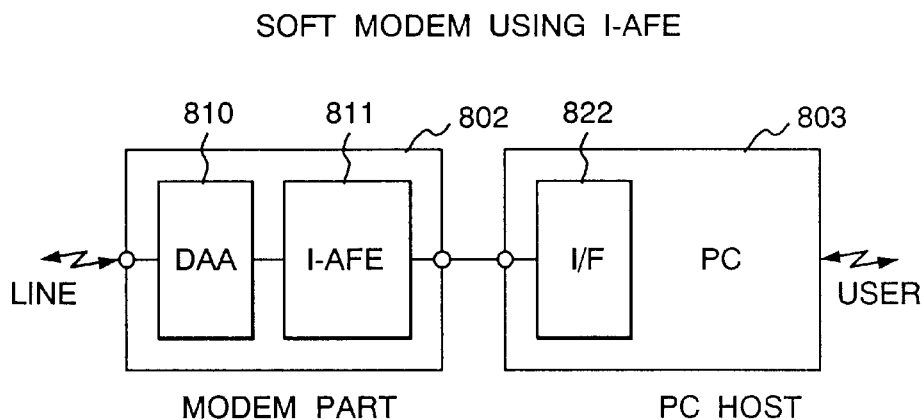

On the other hand, the I/F means 822 may be integrated with the application control means 803 as shown in FIG. 9a. The modem part becomes miniature and low cost by introducing I/F means into the application control means.

Figure 9B:
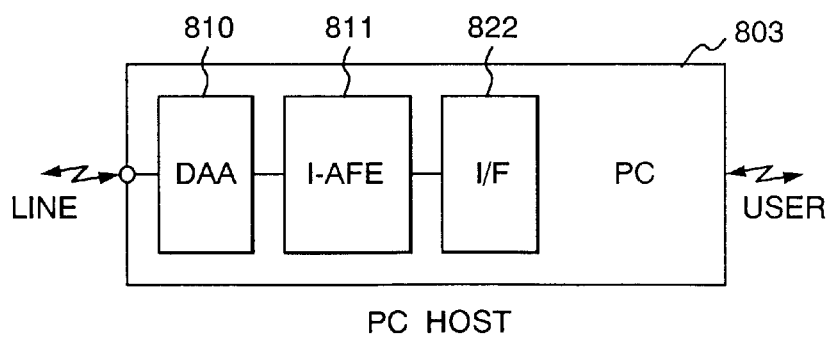

FIG. 9b shows an embodiment in which all the constitutional elements of the soft modem are introduced into the application control means 805. In the note PC, PDA, and cluster type modem device in which the modem section and the PC section are integrated, the classification of the modem section is originally thin and the arrangement may be decided at the request of others.

As mentioned above, in a modem device and a communication system using a modem, it is clear that by using I-AFE, that is, monolithic isolators, the insulating transformer can be deleted, and the number of photo-couplers can be decreased, and miniaturization and improvement of economical efficiency of the equipment can be realized.

As a boundary between the modem section and the PC section, in the respect of standardization, there are a parallel bus like the PCI standard and a serial bus like the IEEE1394 or USB, and the establishment of a constitution suited to these buses is effective in spreading of application of the present invention, and an effect of miniaturization and improvement of economical efficiency is produced.

In an embodiment shown in FIGS. 8a, 8b and 9a, 9b circuits in line side are fed from the power source in the line side while being bordered by the isolator in I-AFE. Namely, in the case of the I-AFE having structure according to FIG. 1, such as the analog-digital converter (ADC) and digital analog converter (DAC) are operated by a power from the power source at the line side, accordingly in case of digital isolation in which digital signals pass through the isolator a power consumption in the power source at the side of the application control means (host side namely user side) can be reduced.

Further, during a waiting time such as when down-loading data from the line if power supply to the circuit at the side of application control means is interrupted while using the isolator as the border, for example, the power source for the key board and the display device is turned off, the major operating portions in the telecommunication system shown in FIGS. 8 and 9 are switched to the modem portion which is operated by the power source at the line side, thereby the power consumption by the power source at the side of the application control means is further rendered.

Further, the isolator according to the present invention can be applied to an analog isolation type AFE in which analog signal pass through the isolator. In such instance, although such as an analog digital converter (ADC) and a digital analog converter (DAC) are provided at the side of the application control means while being bordered by the isolator, if the circuit is configured so that the power is supplied to these converter from the line side power source the power consumption by the power source at the side of application control means can be rendered. Further, like the FIGS. 8 and 9 embodiments during waiting time for data fetching such as data down loading, if the power source for such as the key board and the display device is turned off and the power for operating the modem portion is covered by the line side power source, the power consumption at the side of the application control means is further reduced.

As will the appreciated from the above explanation in FIGS. 8 and 9 embodiments such as the analog digital converter (ADC) and the digital-analog converter (DAC) which primarily belong to the side of the application control means namely the user side consume power from the power source at the line side. However, AFE is formed in monolithic by the isolator according to the present invention, thereby the power consumption by the AFE is reduced, thus the consumption of power supplied from the power source at the line side is insignificant.

Figure 10:
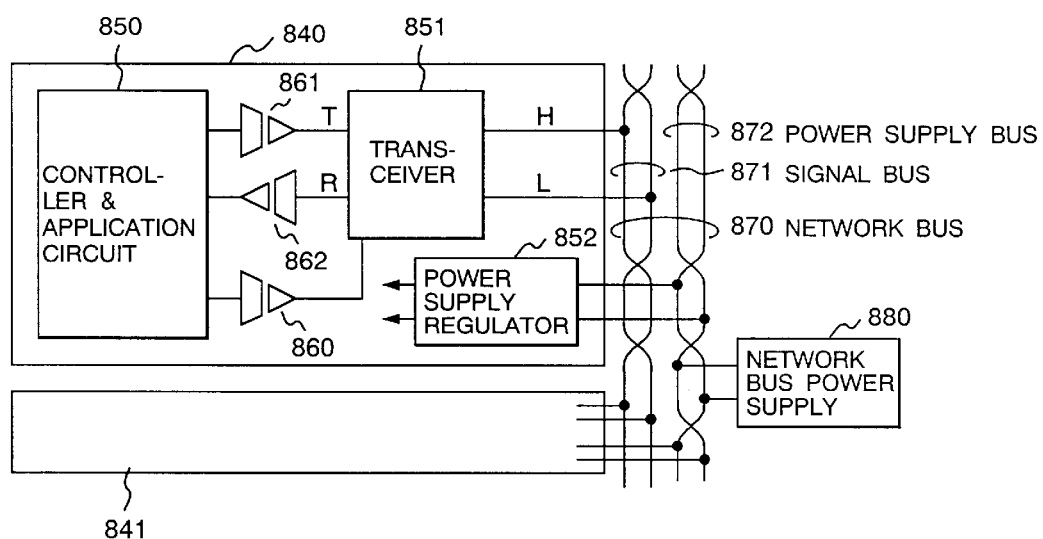
FIG. 10 is a communication system using I-AFE of the other embodiment according to the present invention.

FIG. 10 is a system block diagram of still another embodiment. In FIG. 10, numeral 850 indicates a controller, 860 to 862 isolators, 851 a transceiver, and 852 a power regulator and these units constitute one station 840. Numeral 841 indicates another station whose inside is not disclosed and a plurality of other stations not shown in the drawing are assumed. These stations are connected to a network bus 870 including a signal bus 871, a power bus 872, a control signal bus not shown in the drawing, and a power supply 880 respectively in parallel.

In these stations, the controller and application circuit (controller side circuit portion) 850, the transceiver 851, and the power regulator 852 (network side circuit part) are insulated and separated by the isolators 860 to 862 and the transceiver 851 connects the controller and application circuit 850 and the signal bus 871 via the isolators 860 to 862 so that the network side circuit portion supplies power from the power bus 872. The isolators connect the controller and application circuit 850 and the transceiver 851 and controls the standby operation of the transceiver 851.

To execute communication between a certain station 840 and another station, when the station to be started releases the standby of the transceiver and monitors a receiving signal R, it becomes aware of that the signal bus 871 is free and sends a sending signal T addressed to another station. Another station releases the standby of the transceiver sometimes, monitors the receiving signal R, monitors the status of a control signal of a network bus not shown in the drawing, and checks whether it is a signal addressed to the own station. If it is, the station controls so as to receive the signal next.

This control sequence is an example and can be changed. What may be safely said commonly to those devices connected to the network is insulation and separation of the network and station. Namely, for the network and terminal, in the same way as with the modem, even if an abnormal voltage is generated due to an abnormal situation in others, it is essential to prevent its diffusion and an expensive transformer and photo-coupler are conventionally used as this insulation means. Therefore, a problem of miniaturization and improvement of economical efficiency arises.

When monolithic isolators are applied like this embodiment, there is an advantage that not only miniaturization and improvement of economical efficiency can be realized as a system but also by realizing an IC by appropriate combination with the controller circuit and transceiver circuit, miniaturization and improvement of economical efficiency also can be realized as a circuit.

As explained in this embodiment, according to the present invention, there is an advantage that miniaturization and improvement of economical efficiency can be realized not only for the modem device but also for the network device.

In these examples, an example that power is supplied from the network is explained. However, if another communication system or device is insulated from the application circuit side and power is supplied, the present invention also can be applied to it. In this case, the effect of improvement of economical efficiency may be slightly reduced, but the present invention may be effective including an advantage of miniaturization.

Figure 11A:
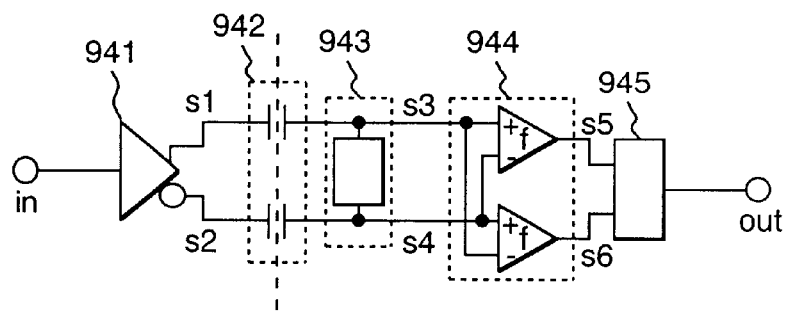
FIG. 11 is a block diagram of the isolator and operation wave form.
Figure 11B:
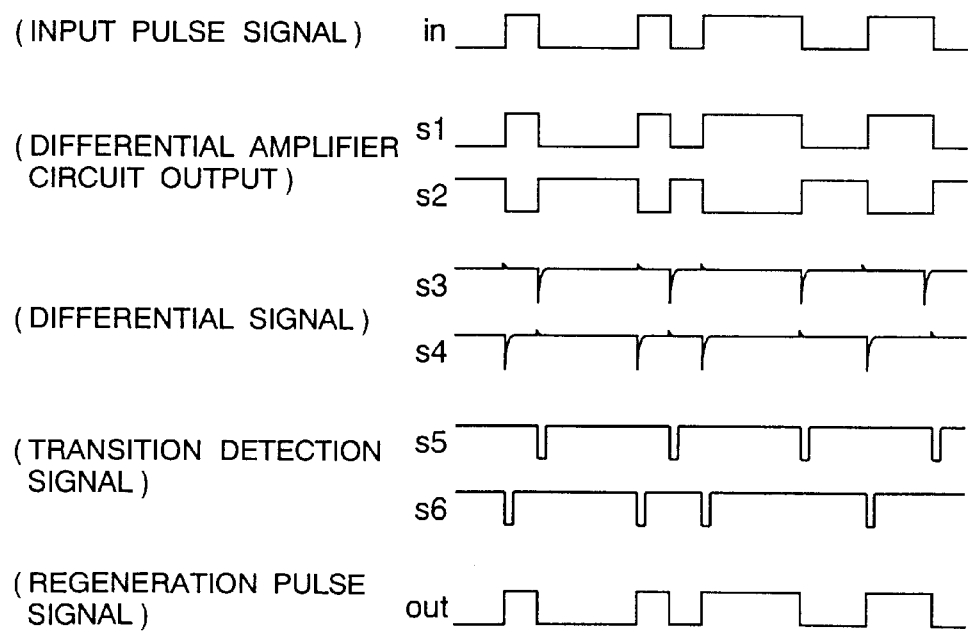

The operation of the isolator of the present invention is explained referring to FIGS. 11a and 11b. FIG. 11a is a block diagram showing the isolator and FIG. 11b is a operating wave form. The isolator includes circuits of differential amplifier 941 which outputs complementary pulse signal s1 and s2 from input pulse signal "in", a couple of insulating capacitors coupling capacitively complementary pulse signal S1,S2 with the second circuit, differential circuit 943 which makes differential signal s3 and s4 from the transmitted signal by the capacitive coupling from the primary side, transition detecting circuit detecting transition timing of input pulse signal from the differential signals s3 and s4, and pulse regeneration circuit regenerating original pulse signals from transition detection signal s5 and s6 detected by transition detection circuit 944.

The pulse signal "in" to be transmitted from the primary side to secondary side generates the complementary pulse signal s2 and s2 by differential amplifier circuit 941 and drives the primary side of the insulated capacitor 942. The differential wave forms s3 and s4 are outputted to the secondary side of the insulating capacitor 942 by insulating capacitor 942 and differential circuit 943 in the primary circuit. The transition detection signal s5 and s6 in relation to the transition timing of the input pulse signal "in" are obtained from the differential wave forms s3 and s4 of the transition detecting circuit 944.

The transition detection signals s5 and s6 regenerate pulses by a pulse regenerating circuit 945 and output the regenerated pulse signals "out". According to the present invention, the input pulse signals "in" is transmitted from primary side to secondary side through the insulated capacitor 942 inserted between the primary side circuit and secondary side circuit insulated each other.

Next, the insulating coupler transmission method of the present invention will be explained by referring to FIGS. 12a to 12f. Various transmission methods are shown using block diagrams in FIG. 12a to 12f. The insulating barriers are the capacitors of the present invention. The insulating coupler of the present invention uses two insulating barriers and is driven by a complementary waveform so that a signal can be precisely transmitted even if the receiver side is floating.

The input circuit is supplied with power from the power terminal VDD1 and the grounding terminal VSS1 and converts and outputs the signal received from the input terminal to the wave-form for driving one terminal of the insulating barrier. The output circuit is supplied with power from the power terminal VDD2 and the grounding terminal VSS2, detects the wave-form appearing at the terminal on the opposite side of the insulating barrier, and converts and outputs it to an output signal.

With respect to a converted wave-form, various methods such as the PWM (pulse duty conversion) system for digitizing only the amplitude direction, or the FM system (voltage-frequency conversion) system, or the digital transmission system for also digitizing the time base direction can be used.

Figure 12A:
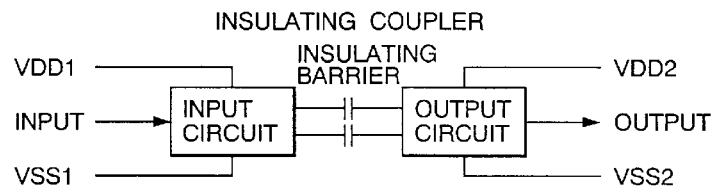
FIG. 12 is a circuit block diagram of an isolator according to the present invention.
Figure 12B:
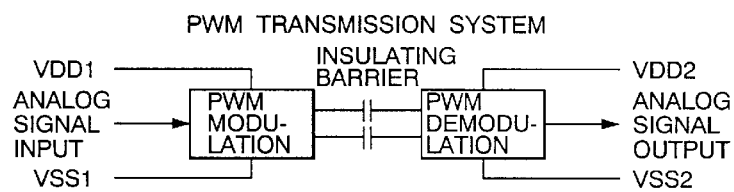

FIG. 12b shows a case of the PWM transmission system. In the PWM system, the input circuit samples the inputted analog signal in the fixed period T more than several tens times of the signal band and converts and transmits the amplitude to the duty (0 volt input corresponds to 50% duty) in the time base direction and the output circuit detects it and converts the duty to an amplitude value once again, hence reproduces the input wave form, and outputs an analog signal. By analogically processing the duty, a high resolution in principle can be obtained. Needless to say, a digital signal may be transmitted.

Figure 12C:
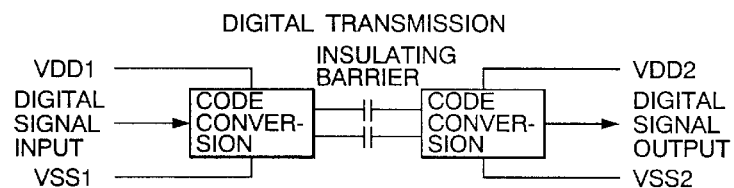

FIG. 12c shows a case of digital transmission of the present invention. In the digital transmission, the code conversion is executed, for example, like the Manchester code so that the same level is not continued in the transmission wave form, and then the insulating barrier is driven, and the output circuit detects it, reversely converts it, and reproduces the original digital signal. In this case, in synchronization with the transfer frequency of the input digital signal, the code conversion and reverse conversion are executed. This method is characterized in that since little conversion is executed in the amplitude direction, it is hard to be affected by noise.

Figure 12D:
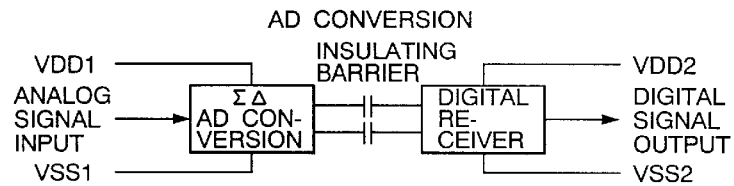

FIG. 12d shows a case that AD conversion input is executed via the insulating barrier. The input circuit converts an analog input signal from analog to digital, then performs the same code conversion as that of 12(c), and drives the insulating barrier. The output circuit detects it, performs reverse code conversion, and then outputs a digital signal.

Figure 12E:
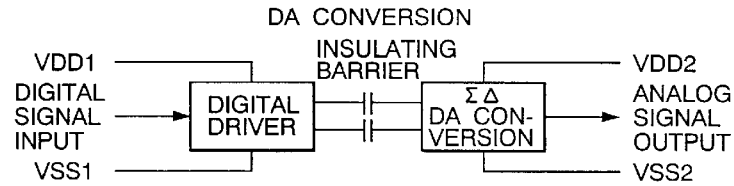

FIG. 12e shows a case that DA conversion output is reversely executed via the insulating barrier. The input circuit performs the same code conversion as that of 12c for a digital input signal and then drives the insulating barrier. The output circuit detects it, performs reverse code conversion, converts it from digital to analog, and then outputs a digital signal.

Figure 12F:
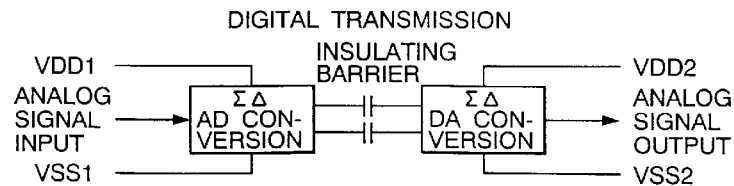

FIG. 12f shows a case that 12d and 12e are combined and input and output of an analog signal are executed by use of AD conversion and DA conversion. The signal transmission system from 12d to 12f is a constitution suitable for the sound signal processing analog front end of a modem and the line interface when the DSP is selected as a connection destination of a digital signal.

These systems can be integrated on a monolithic IC by the present invention. More concretely, although the aforementioned capacitive insulating barrier is a circuit for connecting two circuits, the stray capacity between the insulating barrier and the substrate is large and greatly different from that when the input circuit, output circuit, and insulating barrier are separately created and combined.

Therefore, the transmission efficient by the insulating barrier is low such as 1-severalth. In the aforementioned embodiment, in the first stage of the output circuit, the amplifier circuit is arranged and the detection process and demodulation process are performed behind it.

Figure 13A:
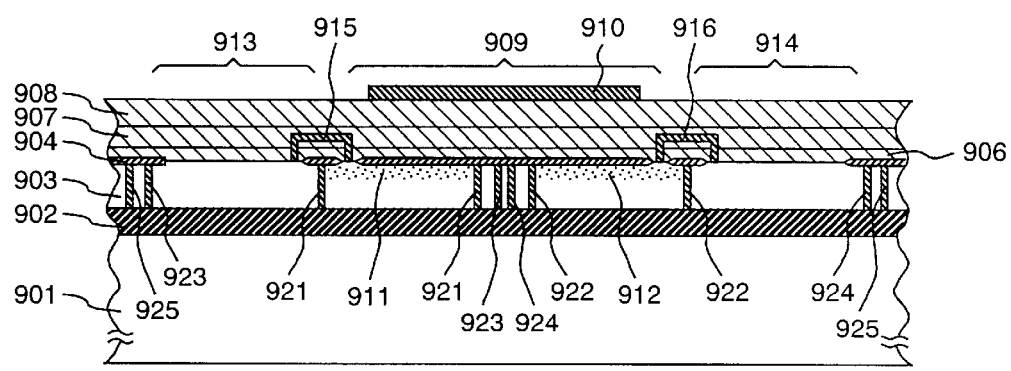
FIG. 13 is a plane view and a cross sectional view of the isolator showing a concrete embodiment according to the present invention.
Figure 13B:
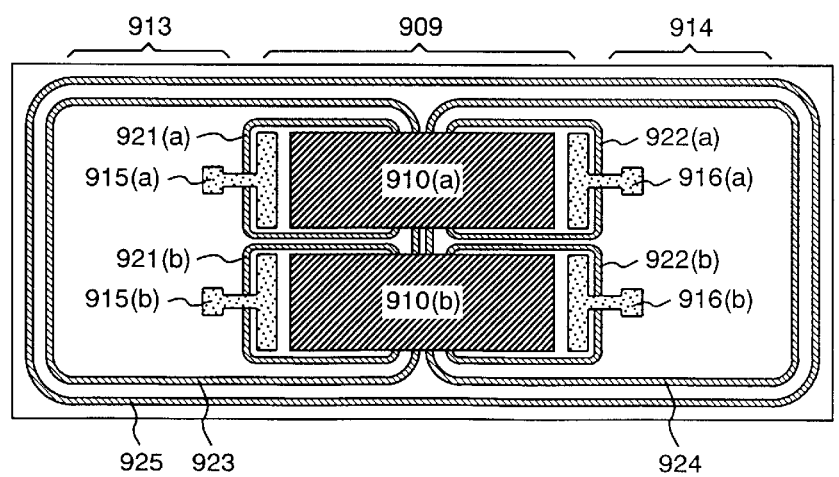

FIGS. 13a and 13b are respectively the cross sectional view and plane view of a first embodiment of monolithic isolators according to the present embodiment. Numerals 901, 902 and 903 in the cross sectional view are respectively a support substrate, a buried oxide film and a silicon layer of an SOI (Silicon On Insulator) substrate. Numeral 904 is a LOCOS (Local Oxidation of Silicon formed by thermal oxidation which is used for element separation such as in CMOS devices.

Numerals from 921 to 925 are trench insulator films which extend from the surface of the LOCOS to the buried oxide film 902 and are formed in a strip shape, numerals 911 and 912 are respectively primary side and secondary side capacitor electrodes formed respectively by diffusion layers. Numerals 906, 907 and 908 are respectively a first metal layer backing interlayer film, a second metal layer backing interlayer film and a third metal layer backing the interlayer film. Numeral 910 is an intermediate electrode formed with the third metal layer. Numerals 915 and 916 are respectively lead out wires to the primary side electrode and the secondary side electrode. Numeral 909 is a capacitor region. Numerals 913 and 914 are respectively circuit regions for the primary side and secondary side except for the capacitor region. Sufixes "a" and "b" in the plane view correspond to a positive signals and respective signals of transmission signals constituted by complementary signals.

After forming the thermal oxidation film LOCOS 904 for the device isolation on the SOI wafer constituted by the support substrate 901. The buried oxide substrate 902 and the silicon layer 903. The trench insulator film s 921 through 925 are formed the trench insulator film 925 is one which surrounds the outermost circumference of the insulator chip and prevents current leakage from the chip scribing end thereof. Through forming the multiple of trench insulator films, the reliability of the device is increased.

Reference numerals 923 and 924 are respectively the trench insulator films surrounding the primary side and the secondary side circuit regions and contribute to share a part of withstanding voltage for the insulation between the primary side and the secondary side. The Reference numeral 921 is the trench insulator film for separating the primary side capacitor electrode region provided in the primary side circuit region. The numeral 922 is the trench insulator film for separating the secondary side capacitor electrode region provided on the secondary side circuit region. The numeral 910 is the intermediate electrode for the capacitor formed on the third metal layer.

The capacitor for the insulator according to the present embodiment which realizes the signal transmission between electrically insulated primary side and secondary side through the capacitive coupling is constituted by a series of capacitors, in that a first capacitor constituted by the primary side capacitor electrode 911 and the intermediate electrode 910 and a second capacitor constituted by the intermediate electrode 910 and the secondary side capacitor 912. The intermediate electrode 910 is provided over the interlayer insulator films 906, 907 and 908 across the primary side circuit region and the secondary side circuit region. Namely, through the intermediate electrode 910 the first capacitor is shifted or turned to the second capacitor, therefore, the both capacitors are formed in symmetry and their dispersion in withstanding insulator voltage and capacitance of the two capacitors connected in series is reduced. Further, the insulator film of the respective capacitor is constituted by the following four layers, in that (1) LOCOS 904, (2) the first metal layer backing interlayer film 906 (3) second metal layer backing interlayer film 907 (4) third metal layer backing interlayer film 908. Namely, since the insulator film is constituted by making use of a plurality of layers in the thick insulator film, the insulation withstanding voltage thereof is ensured.

In the present embodiment, the insulation withstanding voltage between the primary side and the secondary side is ensured by the interlayer insulator film in the SOI including the buried oxide film, the trench insulator film and the LOCOS. Further, the insulation withstanding voltage of the capacitor for carrying the signal transmission between the primary side and the secondary side is ensured by the interlayer insulator films including the LOCOS between the diffusion layers and the metal layers.

In the present embodiment, since the insulation separation between the primary side and the secondary side can be activated on the common semiconductor substrate and further the capacitor having a high insulation withstanding voltage is formed between the primary side and the secondary side, a monolithic isolator is realized. Further, since the capacitor between the primary side and the secondary side is constituted by the interlayer films, a desired capacitance can be obtained regardless to the silicon film thickness in the SOI.

Figure 14A:
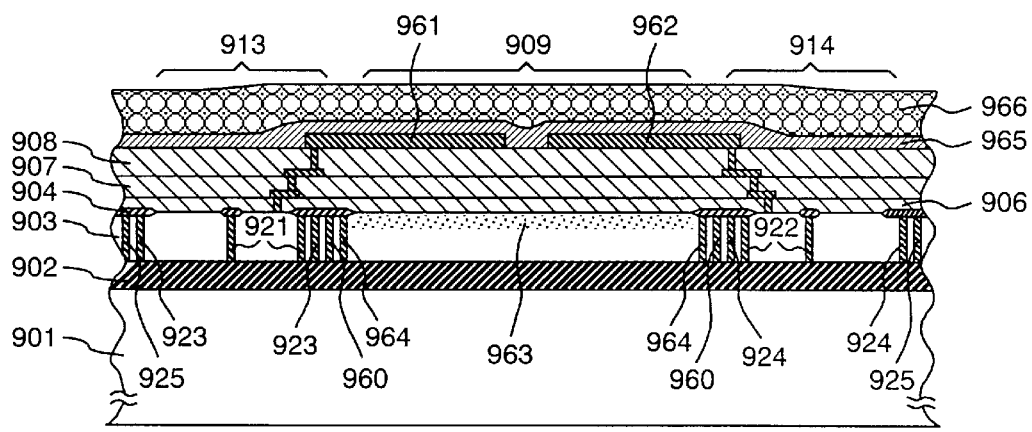
FIG. 14 is a plane view and a cross sectional view of the isolator showing a concrete embodiment according to the present invention.
Figure 14B:
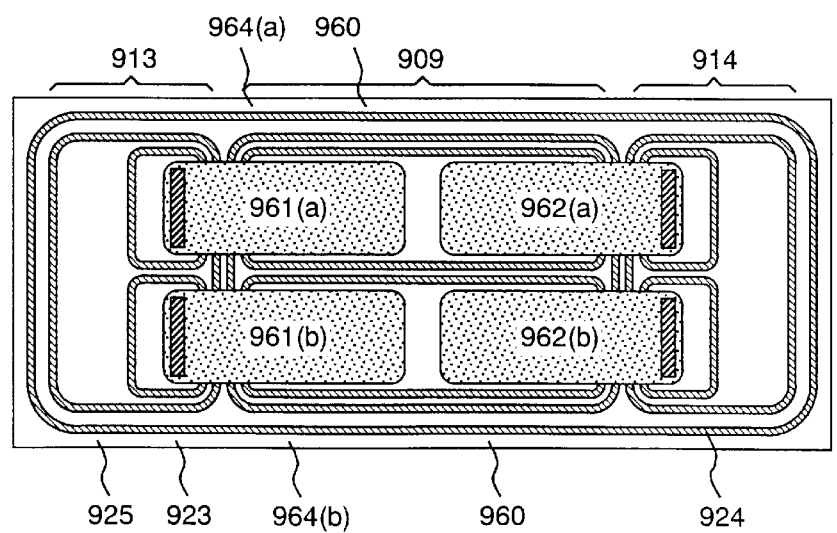

FIG. 14a and 14b are respectively cross sectional view and plane view of a second embodiment of monolithic isolators according to the present invention. The present embodiment is substantially the same as FIG. 13 embodiment except that (1) the primary side and the secondary side electrodes for the insulator are constituted by third layer metal and the intermediate electrode is constituted the diffusion layer and (2) other than the primary side circuit region and the secondary side circuit region, an independent capacitor region is provided.

Therefore, only the different points from FIG. 13 embodiment will be explained. Numerals 923, 924, and 964 are trench insulator films which extend from the surface of the LOCOS 904 to the buried oxide film 902 and are formed in a strip shape. Numerals 961 and 962 are respectively capacitor electrodes for the primary side and the secondary side formed by a third layer metal. Numeral 963 is the intermediate electrode formed by a diffusion layer. Numeral 965 is a SiN film serving as a passivation film and numeral 966 is a protective film formed with PIQ. Numeral 909 is a capacitor region. Numerals 913 and 914 are respectively circuit regions for the primary side and the secondary side.

Suffixes (a) and (b) in the plane view correspond to a positive signals and negative signals of transmission signals constituted by complementary signals. Numeral 960 is a trench insulator region for separating the capacitor region from other regions. Numeral 963 is the capacitor intermediate electrode formed by the diffusion layer. The capacitor for the isolator according to the present embodiment which realizes the signal transmission between electrically insulated primary side and secondary side through the capacitive coupling is constituted by a series of capacitors, in that a first capacitor constituted by the primary side capacitor electrode 961 and the intermediate electrode 963 and a second capacitor constituted by the intermediate electrode 963 and the secondary side capacitor 962.

The intermediate electrode 962 is arranged form the bottom portion (substrate side) of the primary side capacitor electrode 961 over the substrate side of the secondary capacitor electrode 962. Namely, through the intermediate electrode 963 the first capacitor is shifted to the second capacitor, therefore the both capacitors are formed in symmetry and their dispersion in withstanding insulation voltage and capacitance of the two capacitors connected in series is reduced.

In the present embodiment, the insulation withstanding voltage between the primary side and the secondary side is ensured by the interlayer insulator films in the SOI including the buried oxide film, the trench insulator film and the LOCOS. Further, the insulation withstanding voltage of the capacitor for carrying out the signal transmission between the primary side and the secondary side is ensured by the interlayer insulator films including the LOCOS between the diffusion layers and the metal layers.

In the present embodiment, since the insulation separation between the primary side and the secondary side can be achieved on the common semiconductor substrate and further, the capacitor having a high insulation withstanding voltage is formed between the primary side and the secondary side, a monolithic isolator is realized. Further, since the capacitor between the primary side and the secondary side is constituted by the interlayer films, a desired capacitance can be obtained regardless to the silicon film thickness in the SOI.

Further, in the present embodiment, the protective film constituted by the three layers metal is illustrated in order to ensure the withstanding voltage between the primary side and the secondary side capacitive electrodes, it will be needless to say that the same protective film can be used for the embodiments of FIG. 13 and others.

FIG. 15 shows constitutional examples of the capacitor insulator film provided between the primary side and the secondary side.

Figure 15A:
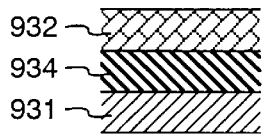
FIG. 15 is a cross sectional view of the isolator according to the present invention.

In FIG. 15a, a diffusion layer 931 and a poly-silicon layer 932 are used as the electrode layers and the insulator layer is formed by a thermal oxidation film 934. Since the insulation break down and electric field resistance of the thermal oxidation film is high and a desired insulation withstanding voltage can be realized with a further thinner film, the area us ed for the capacitor can be reduced.

Figure 15B:
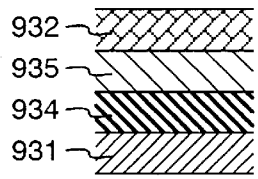

In FIG. 15b, a diffusion layer 931 and a poly-silicon layer 932 are used as the electrode layers, and the insulator layer is formed by a thermal oxidation film 932 and a CVD insulator film 935. In the present constitution, when it is difficult to increase the film thickness of the thermal oxidation film due to limitation such as in connection with process, a desired withstanding voltage is realized by laminating the CVD insulator film.

Figure 15C:
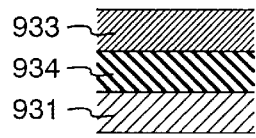

In FIG. 15c, a diffusion layer 931 and a metal layer 993 are used as the electrode layers, and the insulator layer is formed by a thermal oxidation film 934. In the present constitution, like the constitution in FIG. 15a the area for the capacitor is reduced.

Figure 15D:
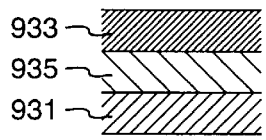
Figure 15E:
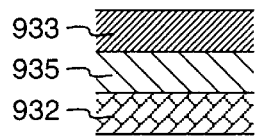

In FIG. 15d, a diffusion layer 932 and a metal layer 933 are used as the electrode layers, and the insulator layer is formed by a CVD insulator film 935. In the present constitution, a desired withstanding voltage can be obtained by the lamination formation. In FIG. 15e, a poly-silicon layer 932 and a metal layer 933 are used as the electrode layers, and the insulator layer is formed by a CVD insulator film 935. Since the CVD insulator film 635 can be formed by dividing more than two layers, the stress on the CVD insulator film is reduced and the cracking and peeling thereof is prevented.

Figure 15F:
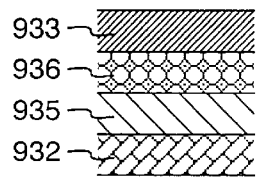

In FIG. 15f, a poly-silicon layer 932 and a metal layer 933 are used as the electrode layers, and the insulator layer is formed by a CVD insulator film 935 and a polymer insulator film 936.

In the present constitution, an electric field relaxation to a stepwise configuration ca be achieved by laminating the CVD insulator film and the polymer insulator film.

Figure 15G:
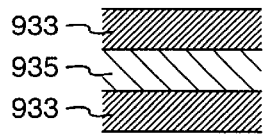

In FIG. 15g, the electrode layers are formed by metal layers 933, and the insulator layer is formed by a CVD insulator film 935. Since the CVD insulator film 635 can be formed by dividing more than two layers, the stress on the CVD insulator film is reduced and the cracking and peeling thereof is prevented.

Figure 15H:
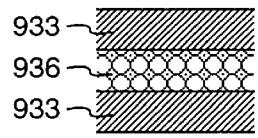

In FIG. 15h, the electrode layers are formed by metal layers 933, and the insulator layer is formed by a polymer insulator film 936. Since the polymer insulator film 936 can be formed by dividing more than two layers, the stress on the polymer insulator film is reduced and the cracking and peeling thereof is prevented.

Figure 15I:
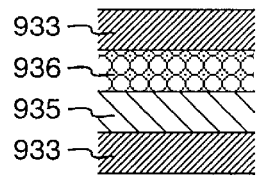

In FIG. 15I, a metal layers 933 are used as the electrode layers, and the insulator layer is formed by a CVD insulator film 935 and a polymer insulator film 936.

Figure 15J:
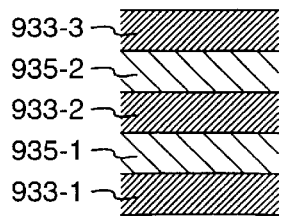

In the present constitution, an electric field relaxation to a stepwise configuration can be achieved by laminating the CVD insulator film and the polymer insulator film. In FIG. 15j, the capacitor electrode is formed by a metal layer 933-1 and a metal layer 933-3, and insulator layers formed by a CVD insulator film 935-1 and a CVD insulator film 935-2 are provided between the electrodes. A metal electrode 933-2 is sandwiched between the CVD insulator films 935-1 and 935-2.

The metal layer 933-2 serves as the intermediate electrode, however, the capacitance of the capacitor is determined only by the total thickness of the CVD insulator films 935-1 and 935-2 and the sandwiched metal layer 933-2 excepts no direct influence thereto. For example, when the capacitor electrodes are constituted by the first metal layer and the third metal layer, the second metal layer can be left as the intermediate electrode, therefore the CVD insulator film 935-1 suffers no damages during the etching process for the second metal layer and the reliability of the insulator film can be ensured.

In the present embodiment, metal layers and the CVD insulator films are used. However, it will be apparent in other constitutions wherein a conductor is sandwiched between the electrodes if the sandwiched conductor is left as the intermediate electrode, the reliability of the insulator film can be likely ensured. According to the present embodiment the structures of the capacitor can be selected depending on limitation due to a process device and capacitance value.

Figure 16:
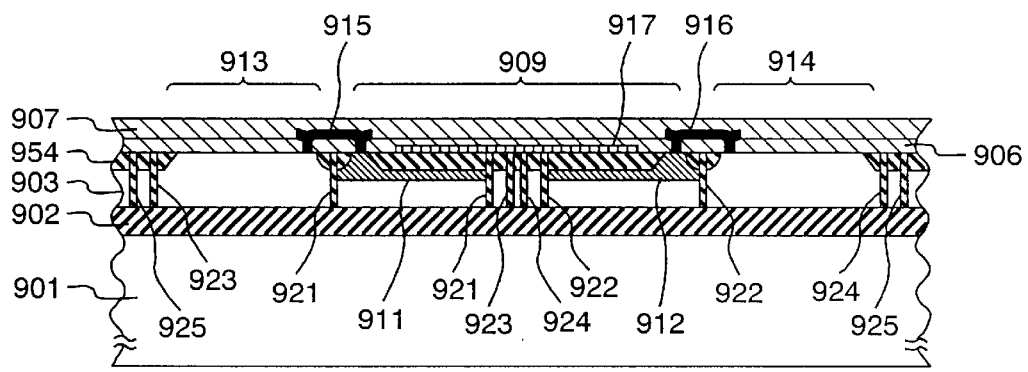
FIG. 16 is a cross sectional view of the capacitor formed by a heat oxide film according to the present invention.

FIG. 16 is a cross sectional view of another embodiment of isolators according to the present invention. Numerals 901, 902 and 903 in the cross sectional view are respectively a support substrate, a buried oxide film and a silicon layer of an SOI substrate. Numeral 954 is an insulator film formed by thermal oxidation which is used for a capacitor of a high withstanding voltage devices. Numerals from 921 to 925 are trench insulator films which extend from the surface of the insulator film 954 to the buried oxide film 902 and are formed in a strip shape, numerals 911 and 912 are primary side and secondary side capacitor electrodes formed respectively by diffusion layers.

Numerals 906 and 907 are respectively a first metal layer backing interlayer film and a second metal layer backing interlayer film. Numeral 917 is an intermediate electrode formed with a poly-silicon layer. Numerals 915 and 916 are respectively are lead-out wires to the primary side electrode and the secondary side electrode numeral 909 is a capacitor region. Numerals 913 and 914 are respectively circuit regions for the primary side and secondary side except for the capacitor region. Further, the plane view of FIG. 16 is substantially the same as that of FIG. 13b.

After forming the insulator film 954 the capacitor of a high withstanding voltage and the thermal oxidation film LOCOS 904 (not shown) for the device separation on the SOI substrate, the trench insulator films 921 through 925 are formed. Before forming the insulator film 954, the portion where the insulator film 954 is to be formed is set back in advance such as by etching and the insulator film 954 is formed to thereby relax a stepwise electric field due to the insulator film 954.

The trench insulator film 925 is one which surrounds the outer most circumference of the isolator chip and prevents leakage from the chip scribing end thereof. Through forming the multiple of trench insulator films the reliability of the device is increased.

Numerals 923 and 924 are respectively the trench insulator film surrounding the primary side and secondary side circuit regions and contribute to share a part of withstanding voltage for the insulation separation between the primary side and the secondary side. The numeral 921 is the trench insulator film for separating the primary side capacitor electrode region provided in the primary side circuit region. The numeral 922 is the trench insulator film for separating the secondary side capacitor electrode region provided in the secondary side circuit region. The numeral 917 is the intermediate electrode for the capacitor formed by a poly-silicon layer.

The capacitor for the isolator according to the present embodiment which realizes the signal transmission between electrically insulated primary side and secondary side through the capacitive coupling is constituted by a series of capacitors, in that a first capacitor constituted by the primary side capacitor electrode 911 and the intermediate electrode 910 and a second capacitor constituted by the intermediate electrode 917 and the secondary side capacitor 912. The insulation withstanding voltage thereof is ensured.

In the present embodiment, the insulation withstanding voltage between the primary side and the secondary side is ensured by the buried oxide film, the trench insulator film and the insulator film in the SOI. Further, the insulation withstanding voltage of the capacitor for carrying out the signal transmission between the primary side and the secondary side is ensured by the insulator film formed by thermal oxidation between the diffusion layers and the poly-silicon layers. In the present embodiment since the insulation separation between the primary side and the secondary side can be achieved on the common semiconductor substrate and further, the capacitor having a high insulation withstanding voltage is formed between the primary side and the secondary side, a monolithic isolator is realized.

Further, since the capacitor between the primary side and the secondary side is constituted by the interlayer films, a desired capacitance can be obtained regardless to the silicon film thickness in the SOI. Still further, since the insulator film for the capacitor of a high withstanding voltage is formed with a thermal oxidation film having a high insulation breakdown electric field resistance, for this reason the film thickness can be thinned for a required insulation breakdown voltage, and the area for the capacitor can be reduced.

Moreover, by setting back in advance the surface where the insulator film for the high withstanding voltage capacitor such as by etching before forming the same, the stepwise electric field caused thereby is reduced.

Figure 17:
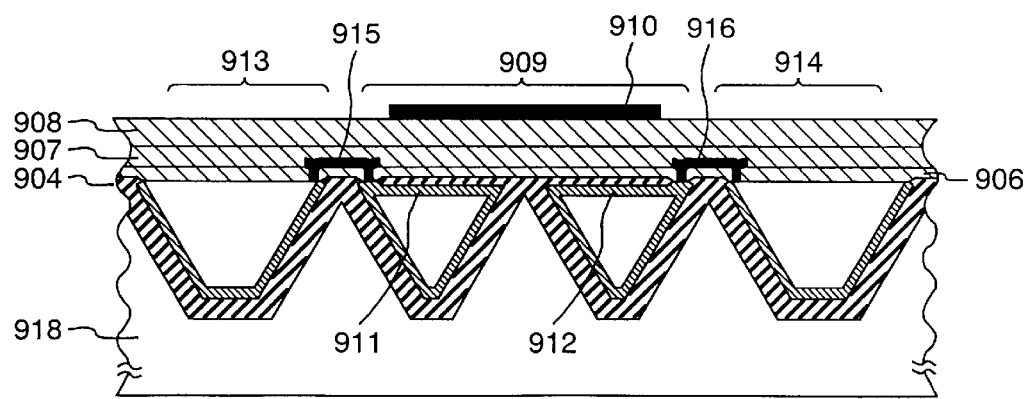
FIG. 17 is a view showing an embodiment using a dielectric separation substrate.

FIG. 17 shows a cross sectional view of a monolithic insulator which uses a dielectric isolation (hereinbelow called as DI) substrate with V shaped trenches. The present embodiment is substantially the same as FIG. 13 embodiment except that the insulating isolation between the primary side and the secondary side and the isolation between the respective capacitor electrode regions are realized by a DI substrate 918. Therefore, the detailed explanation on the silicon portions of the present embodiment is omitted.

According to the present embodiment, the insulation withstanding voltage between the primary side and the secondary side is ensured by the DI substrate and the insulator film as well as, the insulation withstanding voltage of the capacitor for carrying out the signal transmission between the primary side and the secondary side is ensured by the interlayer insulator films between the diffusion layers and the metal layers including the thermal oxidation film. In the present embodiment, since the insulation separation between the primary side and the secondary side can be achieved on the common semiconductor substrate and further, the capacitor having a high insulation withstanding voltage is formed between the primary side and the secondary side, a monolithic isolator is realized. Further, since the capacitor between the primary side and the secondary side is constituted by the interlayer films, a desired withstanding voltage can be obtained depending on the interlayer film thickness.

Figure 18A:
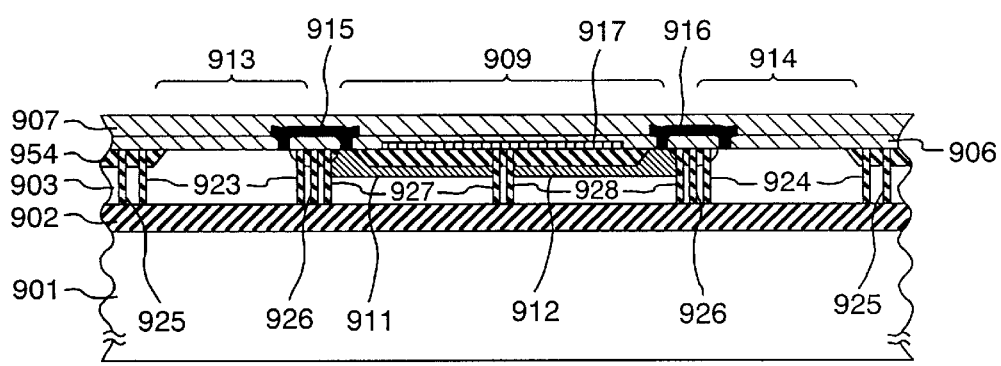
FIG. 18 is a plane vies and cross sectional view showing an embodiment using parallel trench capacitors.
Figure 18B:
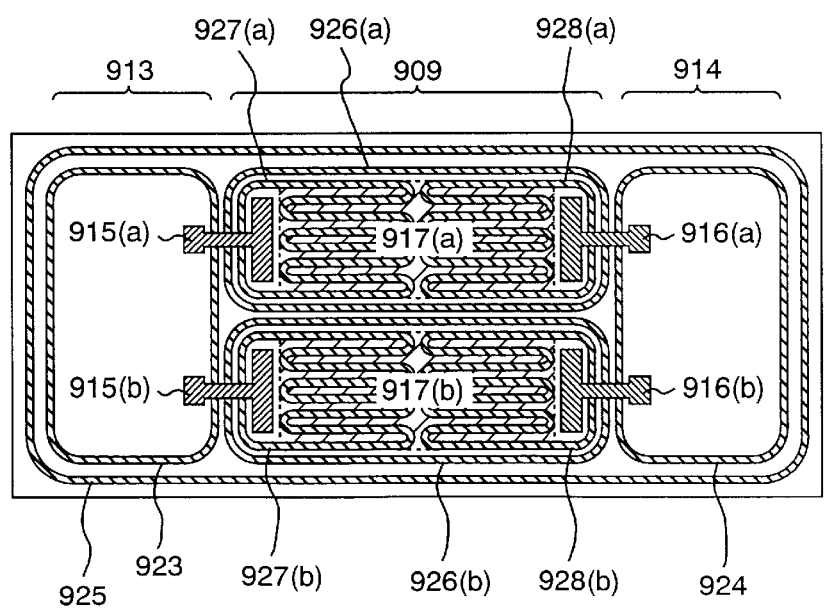

FIGS. 18a and 18b are respectively a cross sectional view and a plane view of still another embodiment of isolators according to the present invention. Numeral 925 is a trench insulator film surrounding the outermost circumference of the isolator chip and is designed to prevent current leakage from the chip scribing end. Unlike FIG. 16 embodiment in the present embodiment trench insulator films 926 inside the trench insulator films 925 insulator-isolate two capacitor regions in addition to the primary side and secondary side circuit regions.

Within the capacitor region isolated by the trench insulator film 926 a trench insulator film 927 for isolating the capacitor electrode region for the primary side and a trench insulator film 928 for isolating the capacitor electrode region for the secondary side are disposed. The trench insulator films 927 and 928 for isolating the capacitor electrode regions themselves act as insulator films for a signal transmission use capacitor to be provided between the primary side and the secondary side.

In addition to FIG. 16 embodiment according to the present embodiment, since the capacitor provided between the primary side and the secondary side is constituted by the capacitors formed between the diffusion layers 911, 912 and the poly-silicon layer 917 and the capacitor formed by the trench insulator films, the capacitance valve can be increased.

Figure 19:
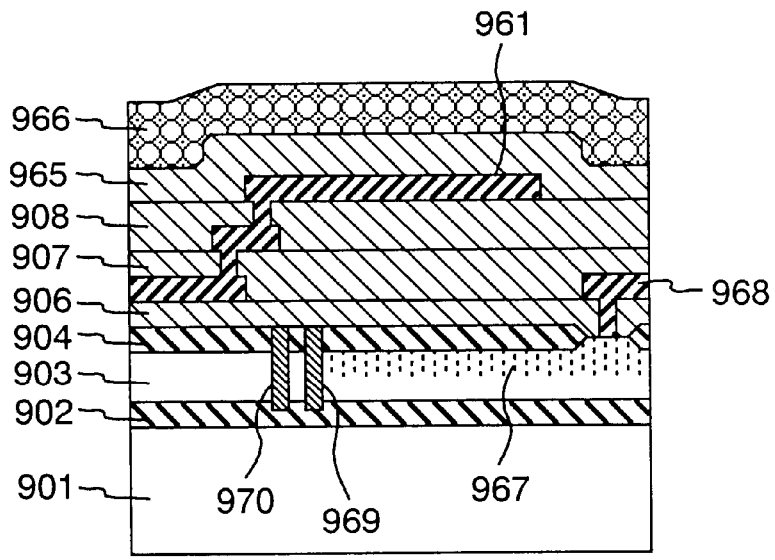
FIG. 19 is a cross sectional view showing the structure of capacitor portion used in the isolator according to the present invention.

FIG. 19 shows a cross sectional view of an embodiment of a capacitor structure in a monolithic isolator. The basic structure thereof is substantially the same as FIG. 14 embodiment. In the present embodiment the capacitor is formed by the primary side electrode making use of the third metal layer 961 and the secondary side electrode making use of the diffusion layer 967 and the turning back with the intermediate electrode is not used. Since the capacitor in the present embodiment is constituted without using the series connection of the capacitors, the lay-out area for the capacitor is reduced.

Figure 20:
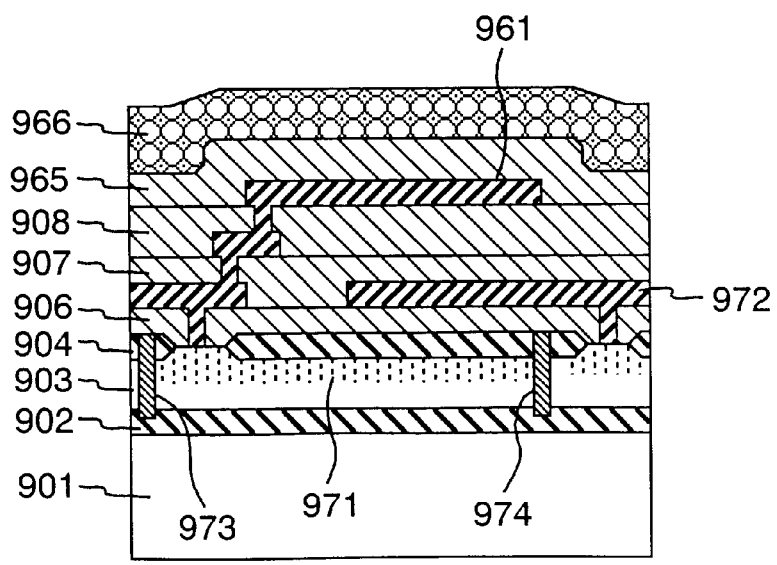
FIG. 20 is a cross sectional view showing the structure of capacitor portion used in the isolator according to the present invention.

FIG. 20 shows a cross sectional view of another embodiment of a capacitor structure in a monolithic isolator like that of FIG. 19. Difference of the present embodiment from FIG. 19 embodiment are that the primary side electrode is constituted by two layers of the third metal layer electrode 961 and the diffusion layer electrode 971, and the secondary side electrode constituted by the first metal layer 972 is sandwiched. In the present embodiment since the secondary side electrode is used as a node for receiving signals the signal receiving side node is hardly susceptible to influences such as external noises, accordingly reliability of signal transmission by the present isolator is improved.

FIGS. 21a through 21f show plane views of a plurality of embodiments when a monolithic isolator of the present invention is formed in an IC form.

Figure 21A:
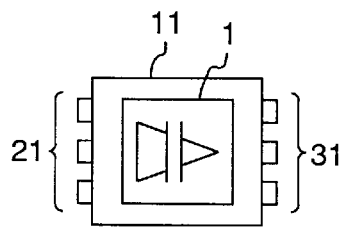
FIG. 21 is a view of the isolator and the IC including the isolator according to the present invention.

FIG. 21a is a plane view when a so called one channel isolator having one input (signal receiving terminal and one output (signal transmitting) terminal is formed into an IC. Numeral 1 is a one channel monolithic isolator chip, numeral 11 is an IC package, numeral 21 are signal receiving (primary) side external pins, numeral 31 are signal transmitting (secondary) side external pins. The primary side external pins 21 consist of three pins of an input terminal a primary side VDD terminal and a primary side GND terminal.

Further, the signal transmitting side external pins 31 likely consist of three pins of an output terminal, a secondary side VDD terminal and a secondary side GND terminal. In the present embodiment, because are chip monolithic isolator is mounted within the IC package, the mounting thereof can be performed easily in comparison with a conventional isolator constituted by a multi-chip or a hybrid chip.

Figure 21B:
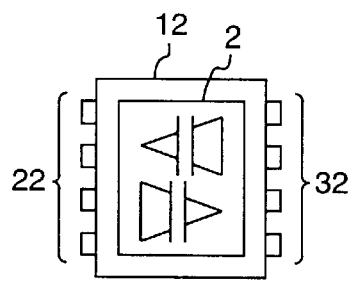

FIG. 21b is a plane view of an isolator formed into an IC form having at both primary side and secondary side are input terminal and one output terminal which permit bi-directional signal transmission and reception. Numeral 2 is two channel (one channel each for signal transmission and reception monolithic isolator chip, numeral 12 is an IC package, numeral 22 is primary side external pins and numeral 32 is secondary side external pins. The primary side external pins 22 consist of four pins of an input terminal, output terminal, a primary side VDD terminal and a primary side GND terminal. Further, the secondary side external pins 32 likely consist of four pins of an output terminal, an input terminal, a secondary side VDD terminal and a secondary side GND terminal.

Figure 21C:
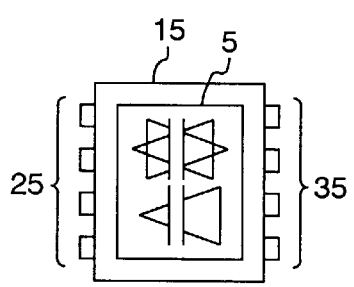

In the present embodiment because one chip monolithic isolator is mounted within the IC package, the mounting thereof can be also performed easily in comparison with a conventional isolator constituted by a multi-chip or a hybrid chip. FIG. 21c is a plane view of an isolator formed into an IC form having at both primary side and secondary side are input and output common terminal which permits bi-directional signal transmission and reception. Numeral 5 is an isolator chip in which one channel transmission and reception common use isolator and are channel unidirectional isolator are formed in monolithic, numeral 15 is an IC package, numeral 25 is primary side external pins, numeral 35 is secondary side external pins.

The primary side external pins 25 consist of four pins of an input and output terminal, control output terminal, a primary side VDD terminal and a primary side GND terminal. Further, the secondary side external pins 35 likely consist of four pins of an output and output terminal, a control input terminal, a secondary side VDD terminal and a secondary side GND terminal. In the present embodiment because one chip monolithic isolator is mounted within the IC package, the mounting thereof can be also performed easily in comparison with a conventional isolator constituted by a multi-chip or a hybrid chip. Further, for signal transmission in which an input and output terminal is used in common a monolithic IC can be used thereby the size and cost thereof can be reduced.

Figure 21D:
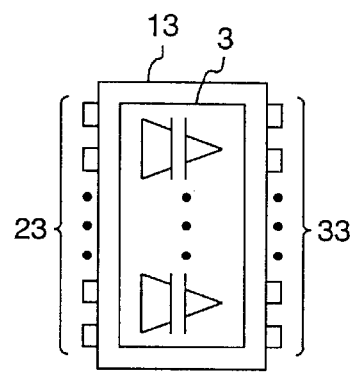

FIG. 21d is a plane view of a so called multi-channel monolithic isolator which is formed into an IC form having more than two input (signal receiving) terminals and more than two output (signal transmitting) terminals. Numeral 3 is a multi-channel monolithic isolator, numeral 13 is an IC package, numeral 23 is signal receiving (primary) side external pins, numeral 33 is signal transmitting (secondary) side external pins. The primary side external pins 23 consist of a plurality of pins of more than two input terminals, a primary side VDD terminal and a primary side GND terminal.

Further, the signal transmission side external pins 33 likely consist of a plurality of pins of more than two output terminals, a secondary side VDD terminal and a secondary side GND terminal. In the present embodiment because multi-channel isolator is mounted in one chip, the mounting thereof can be performed more easily in comparison with a conventional isolator constituted by a multi-chip or a hybrid chip.

Figure 21E:
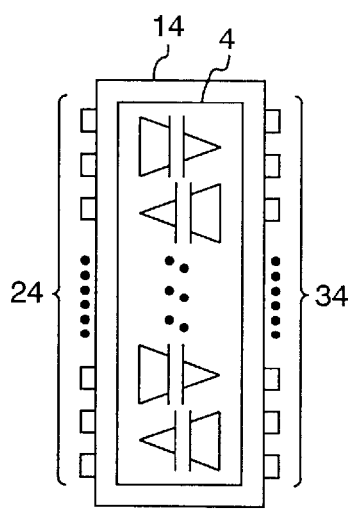

FIG. 21e is a plane view of an isolator which is formed into an IC form having at the primary side n piece of input terminals and m piece of output terminals and at the secondary side m piece of input terminals and n piece of output terminals. Numeral 4 is a multi-channel (from the primary side to the secondary side, signal transmission n channels and signal reception m channels) monolithic isolator chip, numeral 14 is an IC package, numeral 24 is primary side external pins, numeral 34 is secondary side external pins. The primary side external pins 24 consist of n piece of input terminals, m piece of output terminals, a primary side VDD terminal and a primary side GND terminal.

Further, the secondary side external pins 34 likely consist of m piece of input terminals n piece of output terminals, n piece of output terminals, a secondary side VDD terminal and a secondary side GND terminal. In the present embodiment because a multi-channel isolator is likely mounted in one chip, the mounting thereof can be performed more easily in comparison with a conventional isolator constituted by a multi-chip or a hybrid chip.

Figure 21F:
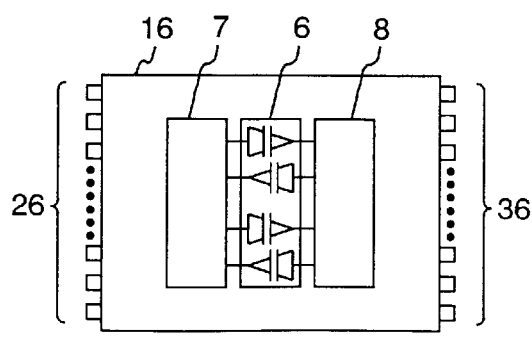

FIG. 21f is a plane view of a multi-chip module (hereinafter called as MCM) having a monolithic isolator. Numeral 6 is a multi-channel monolithic isolator chip, numeral 7 is a primary side peripheral circuit IC, numeral 8 is a secondary side peripheral circuit IC, numeral 16 is a package, numeral 26 is primary side external pins, and numeral 36 is secondary side external pins. In the present embodiment, the MCM is constituted by making use of a monolithic isolator, an advantage that the size of the mounting structure thereof is reduced.

Further, by disposing the monolithic isolator chip between the primary side peripheral circuit IC and the secondary side peripheral circuit IC a desired distance between the primary side and the secondary side can be obtained which ensures the dielectric withstanding voltage between the primary side and the secondary side.

According to the present invention, a telecommunication system and a modern device which permit size reduction are realized as well as a monolithic isolator which contributes therefor is realized.

What is claimed is:

1. An isolator comprising;
   a semiconductor substrate;
   primary and secondary side circuits provided on said semiconductor substrate; and
   a capacitive insulating means positioned on said semiconductor substrate for transferring signals between said primary and secondary sides and for insulating and separating said primary side circuit from said secondary side circuit, either said primary side circuit operating as a driver circuit to input signals to said capacitive insulating means and said secondary side circuit operating as a receiver to output a predetermined signal by detecting signals inputted to said capacitive insulating means, or said secondary side circuit operating as a driver circuit to input signals to said capacitive insulating means and said primary side circuit operating as a receiver to output a predetermined signal by detecting signals inputted to said capacitive insulating means.

2. An isolator according to claim 1, wherein said capacitive insulating means comprises a capacitor having an insulation layer positioned on said semiconductor substrate and a plurality of electrodes.

3. An isolator comprising;
   a semiconductor substrate;
   primary and secondary side circuits provided on said semiconductor substrate and insulated from each other; and
   a capacitive insulating means positioned on said semiconductor substrate for transferring signals between said primary and secondary sides and for insulating and separating said primary side circuit from said secondary side circuit, said capacitive insulating means comprising a capacitor having an insulation layer positioned on said semiconductor substrate and a plurality of electrodes,
   one of said electrodes being bridged between said primary side circuit and secondary side circuit in a floating state.

4. An isolator according to claim 3, wherein said insulation layer comprises an insulation film of interlayer.

5. An isolator according to claim 3, at least one of said plurality of electrodes comprising a metal layer, a polysilicon layer or a diffusion layer formed in said semiconductor substrate.

6. An isolator according to claim 3, wherein said semiconductor substrate comprises an being SOI (Silicon On Insulator) substrate.

7. An isolator according to claim 3, wherein said primary and secondary side circuits are surrounded by an insulation film in said semiconductor substrate.

8. An analog front end comprising:
   a semiconductor substrate;
   primary and secondary side circuits provided on said semiconductor substrate and insulated from each other;
   a capacitive insulating means positioned on said semiconductor substrate for transferring signals between said primary and secondary side circuits and for insulating and separating said primary side circuit from said secondary side circuit; and
   an analog input-output side circuit and a digital input-output side circuit,
   wherein signals are transferred between said analog input-output side circuit and digital side circuit, and said analog input-output side input-output circuit and digital input-output circuit are isolated and separated by said isolator.

9. A modem device having an analog front end for modulating and demodulating signals between application control means and the line, said analog front end being an analog front end according to claim 8.

10. An integral circuit including an analog front end, said analog front end comprising:
   an analog input-output side circuit region;
   a digital input-output side circuit region;
   an isolator region including an isolator, said isolator region including a semiconductor substrate,
   primary and secondary side circuits provided on said semiconductor substrate and insulated from each other; and
   a capacitive insulating means positioned on said semiconductor substrate for transferring signals between said primary and secondary side circuits and for insulating and separating said primary side circuit from said secondary side circuit,
   wherein said isolator region is positioned between said analog input-output side circuit region and said digital input-output side circuit region and transfers signals between said analog input-output side circuit region and said digital input-output side circuit and insulates and separates said analog input-output side circuit region and said digital input-output side circuit region.

11. A modem device having a analog front end for modulating and demodulating signals between application control means and the line, said analog front end being an integral circuit according to claim 10.

12. A communication system comprising a line and a modem device connected to said line and an application control means connected to said line through said modem device, said modem device being a modem device according to claim 9 or 11.

13. An application control means including a modem part connected to a line, said modem part being a modem device according to claim 9 or 11.

14. A card type modem device having a analog front end for modulating and demodulating signals between application control means and the line, said analog front end being an integral circuit according to claim 10 and said integral circuit being mounted on a surface of a circuit substrate.

15. A card type modem according to claim 14, the thickness of said card being 3.3 mm.

16. An application control means including a modem part connected to a line, said modem part being a modem device according to claim 14 or 15.

17. A communication system comprising:
   a network;
   a transceiver connected to said network;
   an application control means for transmitting and receiving signals with said network through said transceiver; and
   an isolator for insulating and separating between said transceiver and said application control means;
   said isolator including:
      a semiconductor substrate;
      primary and secondary side circuits provided on said semiconductor substrate and insulated from each other; and
      a capacitive insulating means positioned on said semiconductor substrate for transferring signals between said primary and secondary side circuits and for insulating and separating said primary side circuit from said secondary side circuit.

* * * * *